(12) United States Patent
Rasmus et al.

(10) Patent No.: US 11,838,000 B2
(45) Date of Patent: Dec. 5, 2023

(54) COMPARATOR INTEGRATION TIME STABILIZATION TECHNIQUE UTILIZING COMMON MODE MITIGATION SCHEME

(71) Applicant: QUALCOMM Incorporated, San Diego, CA (US)

(72) Inventors: Todd Morgan Rasmus, Cary, NC (US); Shih-Wei Chou, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 108 days.

(21) Appl. No.: 17/453,967

(22) Filed: Nov. 8, 2021

(65) Prior Publication Data

US 2023/0143127 A1 May 11, 2023

(51) Int. Cl.
*H03F 3/45* (2006.01)
*H03F 1/02* (2006.01)

(52) U.S. Cl.
CPC ....... *H03F 3/45183* (2013.01); *H03F 1/0227* (2013.01); *H03F 2200/453* (2013.01); *H03F 2200/456* (2013.01); *H03F 2200/555* (2013.01); *H03F 2200/91* (2013.01); *H03F 2203/45008* (2013.01)

(58) Field of Classification Search
CPC ............... H03F 3/45183; H03F 1/0227; H03F 2200/453; H03F 2200/456; H03F 2200/555; H03F 2200/91; H03F 2203/45008; H03F 3/45; H03F 3/45179; H03F 3/45192; H03F 3/45089
USPC ....................................................... 330/253
See application file for complete search history.

(56) References Cited

U.S. PATENT DOCUMENTS

| | | | |
|---|---|---|---|
| 4,555,673 A | 11/1985 | Huijsing et al. | |
| 6,107,882 A * | 8/2000 | Gabara | H03F 3/45237 330/253 |
| 6,268,772 B1 * | 7/2001 | Chen | H03F 3/345 330/288 |
| 6,559,720 B1 | 5/2003 | Huijsing et al. | |
| 8,803,611 B2 * | 8/2014 | Chen | H03F 3/45183 330/261 |
| 9,209,789 B1 * | 12/2015 | Li | H03K 5/02 |
| 9,647,618 B1 | 5/2017 | Yuan et al. | |
| 10,566,035 B2 | 2/2020 | Oak et al. | |
| 10,972,086 B2 | 4/2021 | Agarwal et al. | |
| 11,095,273 B1 | 8/2021 | Rasmus et al. | |
| 2002/0190754 A1 * | 12/2002 | Brunolli | H04L 25/0278 326/83 |

OTHER PUBLICATIONS

International Search Report and Written Opinion—PCT/US2022/046118—ISA/EPO—dated Feb. 16, 2023.

* cited by examiner

*Primary Examiner* — Khanh V Nguyen
(74) *Attorney, Agent, or Firm* — Loza & Loza, LLP

(57) ABSTRACT

Aspects of the present disclosure provide a method for regulating an integration current of a sensing amplifier. The sensing amplifier includes a first input transistor and a second input transistor, wherein a source of the first input transistor and a source of the second input transistor are coupled to a source node. The method includes pulling a current from or sourcing the current to the source node, measuring the integration current, comparing the measured integration current with a reference signal, and adjusting the current pulled from or sourced to the source node based on the comparison.

23 Claims, 11 Drawing Sheets

COMPARATOR INTEGRATION TIME STABILIZATION TECHNIQUE UTILIZING COMMON MODE MITIGATION SCHEME

BACKGROUND

Field

Aspects of the present disclosure relate generally to amplifiers, and more particularly, to sensing amplifiers.

Background

Sensing amplifiers are used in a wide range of applications including memories, analog-to-digital converters, and data samplers in high-speed serializer/deserializer (SerDes). In a system, a sensing amplifier may be used in conjunction with a comparator to resolve (i.e., recover) bits from a differential signal that includes a first input signal (e.g., first input voltage) and a second input signal (e.g., second input voltage). For each bit, the sensing amplifier may integrate the first input signal and integrate the second input signal during a sensing phase, and the comparator may resolve the bit (i.e., makes a bit decision) based on the integrated signals. As data rate increases, it is desirable for the sensing amplifier and the comparator to resolve data bits at a stable rate across varying conditions (e.g., varying common mode voltage) to meet tight timing constraints (e.g., hold times and/or setup times) in the system.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes an error amplifier having a first input, a second input, and an output. The apparatus also includes a sensing amplifier including a first transistor and a second transistor, wherein a source of the first transistor and a source of the second transistor are coupled to a common source node. The apparatus also includes a first current-control device coupled to the common source node, wherein the first current-control device has a control input coupled to the output of the error amplifier. The apparatus also includes a replica circuit coupled to the first input of the error amplifier, wherein the replica circuit includes a third transistor replicating one of the first transistor and the second transistor. The apparatus also includes a second current-control device coupled to a source of the third transistor, wherein the second current-control device has a control input coupled to the output of the error amplifier. The apparatus further includes a reference circuit coupled to the second input of the error amplifier, wherein the reference circuit is configured to output a reference signal.

A second aspect relates to a method for regulating an integration current of a sensing amplifier. The sensing amplifier includes a first input transistor and a second input transistor, wherein a source of the first input transistor and a source of the second input transistor are coupled to a source node. The method includes pulling a current from or sourcing the current to the source node, measuring the integration current, comparing the measured integration current with a reference signal, and adjusting the current pulled from or sourced to the source node based on the comparison.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
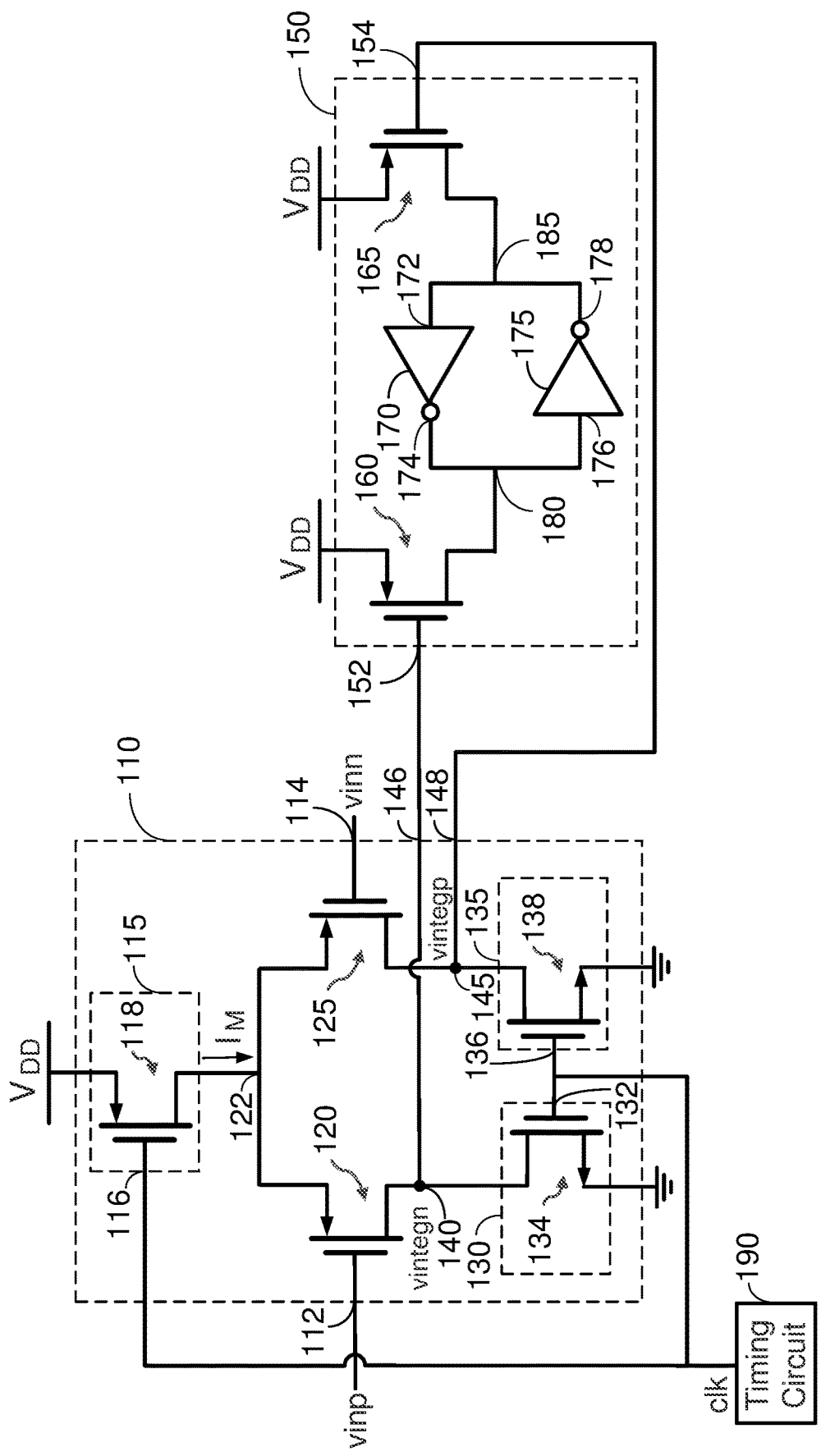
FIG. 1 shows an example of a sensing amplifier according to certain aspects of the present disclosure.

FIG. 1 shows an example of a sensing amplifier 110 according to certain aspects of the present disclosure. The sensing amplifier 110 may also be referred to as a sense amplifier, a sensing stage, or another term. The sensing amplifier 110 includes a first input transistor 120, a second input transistor 125, a first switch 115, a second switch 130, and a third switch 135. In the example shown in FIG. 1, each of the input transistors 120 and 125 is implemented with a respective p-type field effect transistor (PFET). However, it is to be appreciated that each of the input transistors 120 and 125 may be implemented with another type of transistor.

In the example shown in FIG. 1, the sources of the input transistors 120 and 125 are coupled at a common source node 122, and the first switch 115 is coupled between the common source node 122 and a supply rail providing a supply voltage $V_{DD}$. The second switch 130 is coupled between the drain of the first input transistor 120 and a ground, and the third switch 135 is coupled between the drain of the second input transistor 125 and the ground. The sensing amplifier 110 has a first input 112 coupled to the gate of the first input transistor 120, and a second input 114 coupled to the gate of the second input transistor 125. The sensing amplifier 110 also has a first integration node 140 located at the drain of the first input transistor 120, and a second integration node 145 located at the drain of the second input transistor 125. The first integration node 140 is coupled to a first output 146 of the sensing amplifier 110, and the second integration node 145 is coupled to a second output 148 of the sensing amplifier 110.

The first switch 115 has a control input 116, the second switch 130 has a control input 132, and the third switch 135 has a control input 136. As used herein, a "control input" of a switch is an input that controls the on/off state of the switch based on a signal (e.g., a voltage of the signal) applied to the control input. For an example where a switch is implemented with a transistor, the control input is located at the gate of the transistor. In the example shown in FIG. 1, the first switch 115 is implemented with a PFET 118, the second switch 130 is implemented with an n-type field effect transistor (NFET) 134, and the third switch 135 is implemented with an NFET 138. However, it is to be appreciated that the present disclosure is not limited to this example, and that each of the switches 115, 130, and 135 may be implemented with another type of switch (e.g., a transmission gate). In the example shown in FIG. 1, the control input 116 of the first switch 115, the control input 132 of the second switch 130, and the control input 136 of the third switch 135 are driven by a clock signal (labeled "clk") from a timing circuit 190. The timing circuit 190 may include a clock generator (e.g., a phase locked loop (PLL)), a clock-recovery circuit configured to recover the clock signal from a data signal or a control signal, or another type of timing circuit.

In the example in FIG. 1, the sensing amplifier 110 is coupled to a comparator 150 (also referred to as a latching circuit) configured to resolve a bit value based on the voltage (labeled "vintegn") at the first integration node 140 and the voltage (labeled "vintegp") at the second integration node 145 of the sensing amplifier 110. In this example, the comparator 150 has a first input 152 coupled to the first integration node 140 and a second input 154 coupled to the second integration node 145.

The comparator 150 includes a first inverting circuit 170 and a second inverting circuit 175 that are cross coupled with each other to provide regenerative gain that allows the comparator 150 to quickly resolve a bit value, as discussed further below. More particularly, the output 174 of the first inverting circuit 170 is coupled to the input 176 of the second inverting circuit 175, and the output 178 of the second inverting circuit 175 is coupled to the input 172 of the first inverting circuit 170.

The comparator 150 also includes a first drive transistor 160 and a second drive transistor 165. In the example shown in FIG. 1, each of the drive transistors 160 and 165 is implemented with a PFET. However, it is to be appreciated that the drive transistors 160 and 165 are not limited to this example. In this example, the source of the first drive transistor 160 is coupled to the supply rail, the gate of the first drive transistor 160 is coupled to the first input 152 of the comparator 150 (and hence the first integration node 140), and the drain of the first drive transistor 160 is coupled between the output 174 of the first inverting circuit 170 and the input 176 of the second inverting circuit 175. The source of the second drive transistor 165 is coupled to the supply rail, the gate of the second drive transistor 165 is coupled to the second input 154 of the comparator 150 (and hence the second integration node 145), and the drain of the second drive transistor 165 is coupled between the output 178 of the second inverting circuit 175 and the input 172 of the first inverting circuit 170.

The comparator 150 has a first output 180 and a second output 185. In one example, the first output 180 outputs the resolved bit and the second output 185 outputs the complement of the resolved bit, or vice versa. The first output 180 and the second output 185 are coupled to a subsequent stage (e.g., a set-reset (SR) latch), as discussed further below.

Exemplary operations of the sensing amplifier 110 and the comparator 150 will now be discussed according to certain aspects.

The first input 112 and the second input 114 of the sensing amplifier 110 receive a differential input voltage from a previous stage (not shown), such as an equalizer. The differential input voltage includes input voltage vinp applied to the gate of the first input transistor 120 and input voltage vinn applied to the gate of the second input transistor 125. In certain aspects, the polarity of the differential input voltage represents a bit value. For example, the differential input voltage may represent a bit value of one when the input voltage vinp is greater than the input voltage vinn, and represent a bit value of zero when the input voltage vinp is less than the input voltage vinn. The gates of the input transistors 120 and 125 may also be biased by a common mode voltage, which may be a DC voltage that is common to both inputs 112 and 114 of the sensing amplifier 110. The common mode voltage may come from the output of the previous stage (e.g., equalizer).

In this example, the sensing amplifier 110 is in a reset phase when the clock signal is high. During the reset phase, the first switch 115 is turned off, and the second switch 130 and the third switch 135 are turned on. As a result, the second switch 130 pulls the first integration node 140 to the ground and the third switch 135 pulls the second integration node 145 to the ground. During the reset phase, the first drive transistor 160 and the second drive transistor 165 in the comparator 150 are turned on. This is because the integration nodes 140 and 145 are pulled low (i.e., to the ground) in the reset phase, and the drive transistors 160 and 165 are implemented with PFETs in this example.

The sensing amplifier 110 enters an integration phase (also referred to as a sensing phase) when the clock signal transitions low. During the integration phase, the first switch 115 is turned on, and the second switch 130 and the third switch 135 are turned off. The turning on of the first switch 115 allows an integration current $I_M$ to flow from the supply rail to the sources of the input transistors 120 and 125 through the first switch 115 via the common source node 122. The integration current $I_M$ is split between the first input transistor 120 and the second input transistor 125, in which a portion of the integration current $I_M$ flows to the first integration node 140 through the first input transistor 120 and another portion of the integration current $I_M$ flows to the second integration node 145 through the second input transistor 125, causing the voltages vintegn and vintegp at the integration nodes 140 and 145, respectively, to rise.

Figure 2:
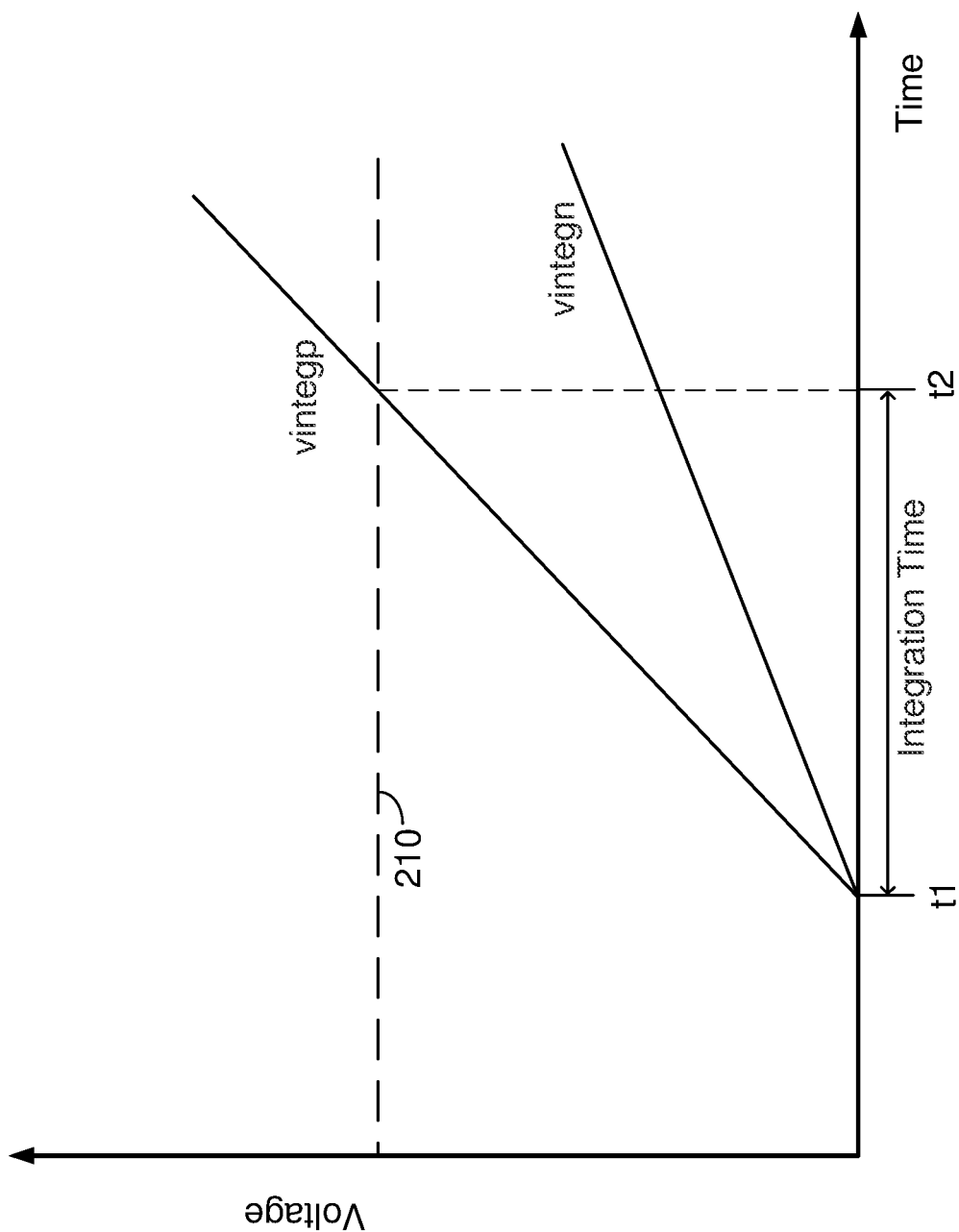
FIG. 2 is a timing diagram showing examples of voltages in the sensing amplifier during an integration phase according to certain aspects of the present disclosure.

In this regard, FIG. 2 shows an example of the rise in the voltages vintegn and vintegp at the integration nodes 140 and 145, respectively, during the integration phase. In this example, the input voltage vinn is lower than the input voltage vinp. As a result, the source-to-gate voltage of the second input transistor 125 is larger than the source-to-gate voltage of the first input transistor 120, which causes a larger portion of the integration current $I_M$ to flow to the second integration node 145 through the second input transistor 125 in this example. Since a larger portion of the integration current $I_M$ flows to the second integration node 145, the voltage vintegp at the second integration node 145 rises faster than the voltage vintegn at the first integration node 140 in this example, as shown in FIG. 2.

At the beginning of the integration phase at time t1, the drive transistors 160 and 165 are both turned on. This is because the integration voltages vintegn and vintegp are initially below a turn-off voltage 210 for turning off the drive transistors 160 and 165. Since the drive transistors 160 and 165 are implemented with PFETs in this example, the turn-off voltage 210 for turning off the drive transistors 160 and 165 is given by Vdd-Vt, where Vdd is the supply voltage and Vt is the threshold voltage of each of the drive transistors 160 and 165. When the integration voltage vintegp rises above the turn-off voltage 210 at time t2, the second drive transistor 165 turns off. At this time, the first drive transistor 160 is still turned on since the integration voltage vintegn is still below the turn-off voltage 210 at this time, as shown in FIG. 2. The turning off of the second drive transistor 165 causes the cross-coupled first inverting circuit 170 and second inverting circuit 175 in the comparator 150 to latch a one at the first output 180 and a zero at the second output 185. Thus, the comparator 150 resolves a bit value of one at the first output 180 when the integration voltage vintegp rises to the turn-off voltage 210 before the integration voltage vintegn. In this example, the integration time of the comparator 150 is given by the time it takes the integration voltage vintegp to reach the turn-off voltage 210, as shown in FIG. 2.

In the example shown in FIG. 2, the input voltage vinn is lower than the input voltage vinp. For the example where the input voltage vinp is lower than the input voltage vinn, a larger portion of the integration current $I_M$ flows to the first integration node 140 during the integration phase, causing the voltage vintegn at the first integration node 140 to rise faster. In this example, the integration voltage vintegn rises to the turn-off voltage 210 before the integration voltage vintegp, which causes the comparator 150 to resolve a bit value of zero at the first output 180.

In the above examples, the integration time is the time it takes the integration voltage vintegp or the integration voltage vintegn to reach the turn-off voltage 210 depending on which one of the input voltages vinp and vinn is lower. When one of the integration voltages vintegp and vintegn reaches the turn-off voltage 210, the comparator 150 resolves a bit value of one or zero at the first output 180 (i.e., makes a bit decision) depending on which one of the integration voltages vintegp and vintegn rises to the turn-off voltage 210 faster. Thus, the integration time determines how long it takes before the comparator 150 resolves the bit value (i.e., makes a bit decision), and therefore determines the speed at which a bit decision is made.

The integration time is highly dependent on the integration current $I_M$ of the sensing amplifier 110. This is because the integration current $I_M$ affects the rise times of the integration voltages vintegp and vintegm. The higher the integration current $I_M$, the faster the rise times and hence the shorter the integration time. The lower the integration current $I_M$, the slower the rise times and hence the longer the integration time.

A challenge is that the integration current $I_M$ depends on the transconductances of the input transistors 120 and 125, which changes with the common mode voltage applied to the gates of the input transistors 120 and 125 (e.g., from the previous stage). As a result, the integration time changes with changes in the common mode voltage, making it difficult to stabilize the integration time across variations in the common mode voltage. Thus, it is desirable to design a scheme that regulates the integration current $I_M$ of the sensing amplifier 110 to maintain a stable integration time across various conditions (e.g., variations in the common mode voltage).

Figure 3:
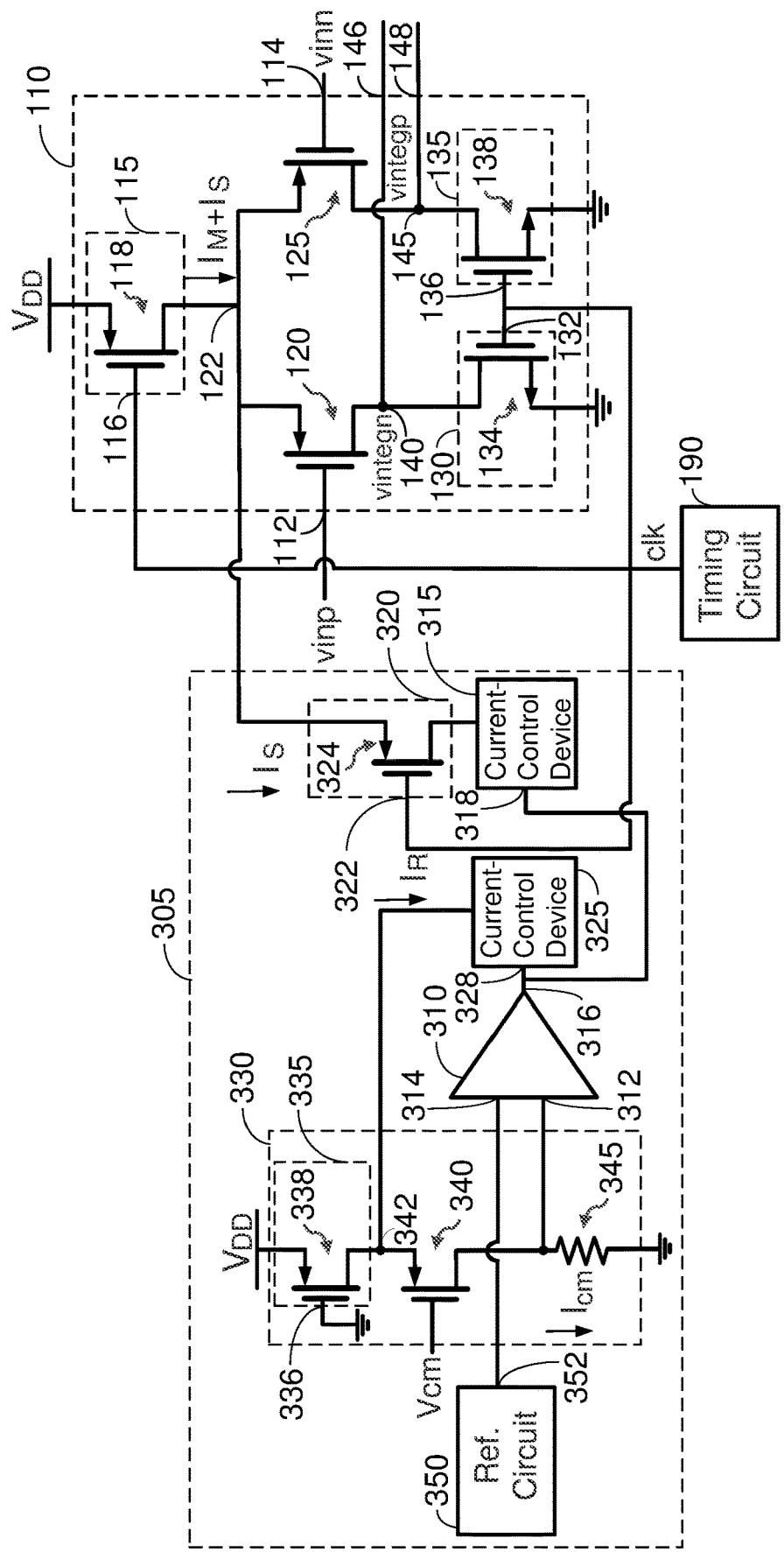
FIG. 3 shows an example of a feedback circuit coupled to the sensing amplifier according to certain aspects of the present disclosure.

FIG. 3 shows an exemplary feedback circuit 305 according to certain aspects of the present disclosure. The feedback circuit 305 is coupled to the common source node 122 (i.e., the sources of the input transistors 120 and 125 of the sensing amplifier 110). The feedback circuit 305 is configured to regulate the integration current $I_M$ of the sensing amplifier 110 to stabilize the integration time across variations in the common mode voltage, as discussed further below.

The feedback circuit 305 includes an error amplifier 310, a replica circuit 330, a reference circuit 350, a first current-control device 315, a second current-control device 325, and a switch 320. In the example shown in FIG. 3, the switch 320 is coupled between the common source node 122 and the first current-control device 315, and the control input 322 of the switch 320 is driven by the clock signal clk. In this example, the switch 320 is configured to couple the first current-control device 315 to the common source node 122 during the integration phase and decouple the first current-control device 315 from the common source node 122 during the reset phase. In the example shown in FIG. 3, the switch 320 is implemented with a PFET 324, in which the gate of the PFET 324 is coupled to the timing circuit 190 and driven by the clock signal clk. However, it is to be appreciated that the switch 320 is not limited to this example, and that the switch 320 may be implemented with another type of switch.

The first current-control device 315 is configured to pull a current (labeled "Is") from the common source node 122. The first current-control device 315 has a control input 318, in which the first current-control device 315 is configured to control the amount of current that is pulled from the common source node 122 based on a signal (e.g., voltage) input to the control input 318. In the example in FIG. 3, the control input 318 is coupled to the output 316 of the error amplifier 310. Thus, in this example, the amount of current that the first current-control device 315 pulls from the common source node 122 is controlled by the output 316 of the error amplifier 310. It is to be appreciated that the first current-control device 315 may also be referred to as an adjustable current source or another term.

The amount of current Is that the first current-control device 315 pulls from the common source node 122 affects the amount of current that flows from the common source node 122 to the integration nodes 140 and 145 and hence affects the integration current $I_M$ (which is approximately equal to the sum of the currents flowing to the integration nodes 140 and 145). Based on this relationship, the first current-control device 315 may be used to control the integration current $I_M$. For example, to decrease the integration current $I_M$, the error amplifier 310 may increase the amount of current that the first current-control device 315 pulls from the common source node 122. This decreases the integration current $I_M$ by pulling more current away from the integration nodes 140 and 145. To increase the integration current $I_M$, the error amplifier 310 may decrease the amount of current the first current-control device 315 pulls from the common source node 122.

The replica circuit 330 is used to indirectly measure the integration current $I_M$ of the sensing amplifier 110 by generating a replica current (labeled "$I_{cm}$") that tracks the integration current $I_M$. As discussed further below, the replica current $I_{cm}$ allows the error amplifier 310 to track changes in the integration current $I_M$ caused by changes in the common mode voltage at the inputs 112 and 114 of the sensing amplifier 110.

In this example, the replica circuit 330 includes a switch 335, a third input transistor 340, and a current-sensing resistor 345. The switch 335 is coupled between the supply rail $V_{DD}$ and the source of the third input transistor 340 (e.g., PFET), and the current-sensing resistor 345 is coupled between the drain of the third input transistor 340 and the ground.

The switch 335 corresponds to the first switch 115 in the sensing amplifier 110. In the example shown in FIG. 3, the switch 335 is implemented with a PFET 338 that is always turned on by coupling the control input 336 of the switch 335 (and hence the gate of the PFET 338) to the ground.

The third input transistor 340 may be a replica of one of the first input transistor 120 and the second input transistor 125 of the sensing amplifier 110. In certain aspects, the third input transistor 340 may be a scaled-down version of one of the first input transistor 120 and the second input transistor 125. For example, the third input transistor 340 may have one or more dimensions (e.g., gate width and/or gate length) that are scaled down (i.e., reduced) from the one or more dimensions of the one of the first input transistor 120 and the second input transistor 125.

The gate of the third input transistor 340 is biased by the same common mode voltage (labeled "Vcm") as the gates of the input transistors 120 and 125 of the sensing amplifier 110. Exemplary techniques for coupling the common mode voltage Vcm to the gate of the third input transistor 340 are discussed below according to certain aspects. Since the third input transistor 340 is biased by the same common mode voltage Vcm as the input transistors 120 and 125 of the sensing amplifier 110, the replica current $I_{cm}$ flowing through the third input transistor 340 is the same as or proportional to the integration current $I_M$ of the sensing amplifier 110, and therefore tracks the integration current $I_M$. This allows the integration current $I_M$ to be indirectly measured using the replica current $I_{cm}$. For the example where the third input transistor 340 is a scaled-down version of one of the first input transistor 120 and the second input transistor 125, the replica current $I_{cm}$ is proportional to the integration current $I_M$ (i.e., approximately equal to the integration current $I_M$ multiplied by a proportionality factor that is less than one).

In this example, the third input transistor 340 in the replica circuit 330 replicates one of the first input transistor 120 and the second input transistor 125. This is possible because the replica circuit 330 is used to track changes in the integration current $I_M$ caused by changes in the common mode voltage, and the common mode voltage is common to both input transistors 120 and 125 (i.e., the common mode voltage is applied to the gates of both input transistors 120 and 125). However, it is to be appreciated that the replica circuit 330 is not limited to this example. For example, in other implementations, the replica circuit 330 may include two input transistors replicating both input transistors 120 and 125.

The replica current $I_{cm}$ flows through the current-sensing resistor 345, which is coupled between the drain of the third input transistor 340 and the ground. The current-sensing resistor 345 is configured to convert the replica current $I_{cm}$ flowing through the third input transistor 340 into a corresponding measurement signal. In this example, the measurement signal is a voltage approximately equal to the replica current $I_{cm}$ multiplied by the resistance of the current-sensing resistor 345.

The second current-control device 325 is coupled to a source node 342 of the replica circuit 330, in which the source node 342 is coupled to the source of the third input transistor 340. The second current-control device 325 is configured to pull a current (labeled "$I_R$") from the source node 342 of the replica circuit 330. The second current-control device 325 has a control input 328, in which the second current-control device 325 is configured to control the amount of current that is pulled from the source node 342 based on a signal (e.g., voltage) input to the control input 328. In the example in FIG. 3, the control input 328 is coupled to the output 316 of the error amplifier 310. Thus, in this example, the amount of current that the second current-control device 325 pulls from the source node 342 of the replica circuit 330 is controlled by the output 316 of the error amplifier 310. It is to be appreciated that the second current-control device 325 may also be referred to as an adjustable current source or another term.

As discussed further below, the error amplifier 310 uses the second current-control device 325 to adjust the replica current $I_{cm}$ of the replica circuit 330. For example, to decrease the replica current $I_{cm}$, the error amplifier 310 may increase the amount of current that the second current-control device 325 pulls from the source node 342 of the third input transistor 340. This decreases the replica current $I_{cm}$ by pulling more current from the source node 342, which causes less current to flow through the third input transistor 340 and into the current-sensing resistor 345. To increase the replica current $I_{cm}$, the error amplifier 310 may decrease the amount of current the second current-control device 325 pulls from the source node 342.

The reference circuit 350 is configured to generate a reference signal (e.g., reference voltage) representing a target integration current for the sensing amplifier 110, as discussed further below. The reference circuit 350 outputs the reference signal at an output 352 of the reference circuit 350. An exemplary implementation of the reference circuit 350 is discussed further below with reference to FIG. 4.

The error amplifier 310 has a first input 312 configured to receive the measurement signal from the replica circuit 330 and a second input 314 configured to receive the reference signal representing the target integration current from the reference circuit 350. In the example shown in FIG. 3, the current-sensing resistor 345 is coupled between the first input 312 of the error amplifier 310 and the ground. Thus, in this example, the measurement signal from the replica circuit 330 is provided by the voltage across the current-sensing resistor 345, which is approximately equal to the replica current $I_{cm}$ multiplied by the resistance of the current-sensing resistor 345. To receive the reference signal from the reference circuit 350, the second input 314 of the error amplifier 310 is coupled to the output 352 of the reference circuit 350.

As discussed further below, the error amplifier 310 adjusts the integration current $I_M$ of the sensing amplifier 110 based on the reference signal and the measurement signal using the first current-control device 315, and the error amplifier 310 adjusts the replica current $I_{cm}$ of the replica circuit 330 based on the reference signal and the measurement signal using the second current-control device 325. The error amplifier 310 adjusts the replica current $I_{cm}$ of the replica circuit 330 using the second current-control device 325 in a similar manner as the error amplifier 310 adjusts the integration current $I_M$ of the sensing amplifier 110 using the first current-control device 315. As discussed further below, this allows the error amplifier 310 to track adjustments to the integration current $I_M$ by the first current-control device 315 by tracking similar adjustments to the replica current $I_{cm}$ by the second current-control device 325 using the measurement signal.

Exemplary operations of the feedback circuit 305 will now be discussed according to certain aspects.

The error amplifier 310 receives the measurement signal at the first input 312 from the replica circuit 330 and receives the reference signal representing the target integration current at the second input 314 from the reference circuit 350. The error amplifier 310 is configured to generate an output signal (e.g., voltage) at the output 316 of the error amplifier 310 based on the error (i.e., difference) between the measurement signal and the reference signal. The output signal of the error amplifier 310 is output to the control input 318 of the first current-control device 315 and the control input 328 of the second current-control device 325, in which the first current-control device 315 adjusts the integration current $I_M$ of the sensing amplifier 110 based on the output signal and the second current-control device 325 adjusts the replica current $I_{cm}$ of the replica circuit 330 based on the output signal.

The error amplifier 310 adjusts the output signal based on the detected error (i.e., difference) between the measurement signal and the reference signal in a direction that reduces the error (i.e., difference). Since the output signal of the error amplifier 310 controls the replica current $I_{cm}$ of the replica circuit 330 using the second current-control device 325, the error amplifier 310 adjusts the replica current $I_{cm}$ of the replica circuit 330 using the output signal to keep the measurement signal approximately equal to the reference signal representing the target integration current (i.e., forces the measurement signal to be approximately equal to the reference signal). Since the output signal of the error amplifier 310 also controls the integration current $I_M$ using the first current-control device 315, this causes the error amplifier 310 to adjust the integration current $I_M$ using the first current-control device 315 to keep the integration current $I_M$ of the sensing amplifier 110 approximately equal to the target integration current represented by the reference signal.

When a change in the common mode voltage Vcm causes the integration current $I_M$ to move away from the target integration current, the feedback circuit 305 detects the change in the integration current $I_M$ by detecting a similar change in the replica current $I_{cm}$ of the replica circuit 330 using the measurement signal. In response to detecting the change in the replica current $I_{cm}$ of the replica circuit 330, the error amplifier 310 adjusts the output signal (i.e., voltage) of the error amplifier 310 in a direction that reduces the error (i.e., difference) between the measurement signal and the reference signal. Since the output signal also controls the first current-control device 315, this adjustment in the output signal also causes the first current-control device 315 to adjust the integration current $I_M$ in a direction that reduces the difference between the integration current $I_M$ and the target integration current represented by the reference signal. Using this feedback mechanism, the feedback circuit 305 is able to maintain the integration current $I_M$ at approximately the target integration current across variations in the common mode voltage Vcm.

The feedback circuit 305 is able to respond to either an increase or a decrease in the common mode voltage Vcm to maintain the integration current $I_M$ at approximately the target integration current. Exemplary feedback operations of the feedback circuit 305 are discussed below with reference to FIG. 3 for the case where the common mode voltage Vcm decreases and the case where the common mode voltage Vcm increases according to certain aspects.

For example, a decrease in the common mode voltage Vcm causes the integration current $I_M$ to increase above the target integration current. This is because the decrease in the common mode voltage Vcm increases the transconductances of the input transistors 120 and 125, which increases the integration current $I_M$. The decrease in the common mode voltage Vcm also causes the replica current $I_{cm}$ of the replica circuit 330 to increase (and hence the measurement signal to increase). This is because the third input transistor 340 of the replica circuit 330 is biased by the same common mode voltage Vcm as the input transistors 120 and 125. The corresponding increase in the measurement signal increases the error (i.e., difference) between the measurement signal and the reference signal. In response to the increase in the error in this example, the error amplifier 310 causes the second current-control device 325 to decrease the replica current $I_{cm}$ of the replica circuit 330 to reduce the error. Because the error amplifier 310 also controls the first current-control device 315, the error amplifier 310 causes the first current-control device 315 to decreases the integration current $I_M$, which reduces the difference between the integration current $I_M$ and the target integration current in this case.

An increase in the common mode voltage Vcm causes the integration current $I_M$ to decrease below the target integration current. This is because the increase in the common mode voltage Vcm decreases the transconductances of the input transistors 120 and 125, which decreases the integration current $I_M$. The increase in the common mode voltage Vcm also causes the replica current $I_{cm}$ of the replica circuit 330 to decrease (and hence the measurement signal to decrease). This is because the third input transistor 340 of the replica circuit 330 is biased by the same common mode voltage Vcm as the input transistors 120 and 125. The corresponding decrease in the measurement signal increases the error (i.e., difference) between the measurement signal and the reference signal. In response to the increase in the error in this example, the error amplifier 310 causes the second current-control device 325 to increase the replica current $I_{cm}$ of the replica circuit 330 to reduce the error. Because the error amplifier 310 also controls the first current-control device 315, the error amplifier 310 causes the first current-control device 315 to increase the integration current $I_M$, which reduces the difference between the integration current $I_M$ and the target integration current in this case.

The integration current $I_M$ may also vary due to changes in the transconductances of the input transistors 120 and 125 caused by process, voltage, temperature (PVT) variations. In this case, the third input transistor 340 of the replica circuit 330 may allow the feedback circuit 305 to track changes in the integration current $I_M$ due to changes in the transconductances of the input transistors 120 and 125 caused by PVT variations. For example, the third input transistor 340 of the replica circuit 330 may be integrated on the same chip (i.e., die) as the input transistors 120 and 125 such that the third input transistor 340 experiences the same or similar PVT as the input transistors 120 and 125. As a result, the transconductance of the third input transistor 340 changes in a similar manner as the input transistors 120 and 125 across PVT variations. This causes the replica current $I_{cm}$ to change in a similar manner as the integration current $I_M$ due to PVT variations and therefore enables the replica current $I_{cm}$ to track changes in the integration current $I_M$ due to PVT variations. This allows the feedback circuit 305 to maintain the integration current $I_M$ at approximately the target integration current across PVT variations.

Figure 4:
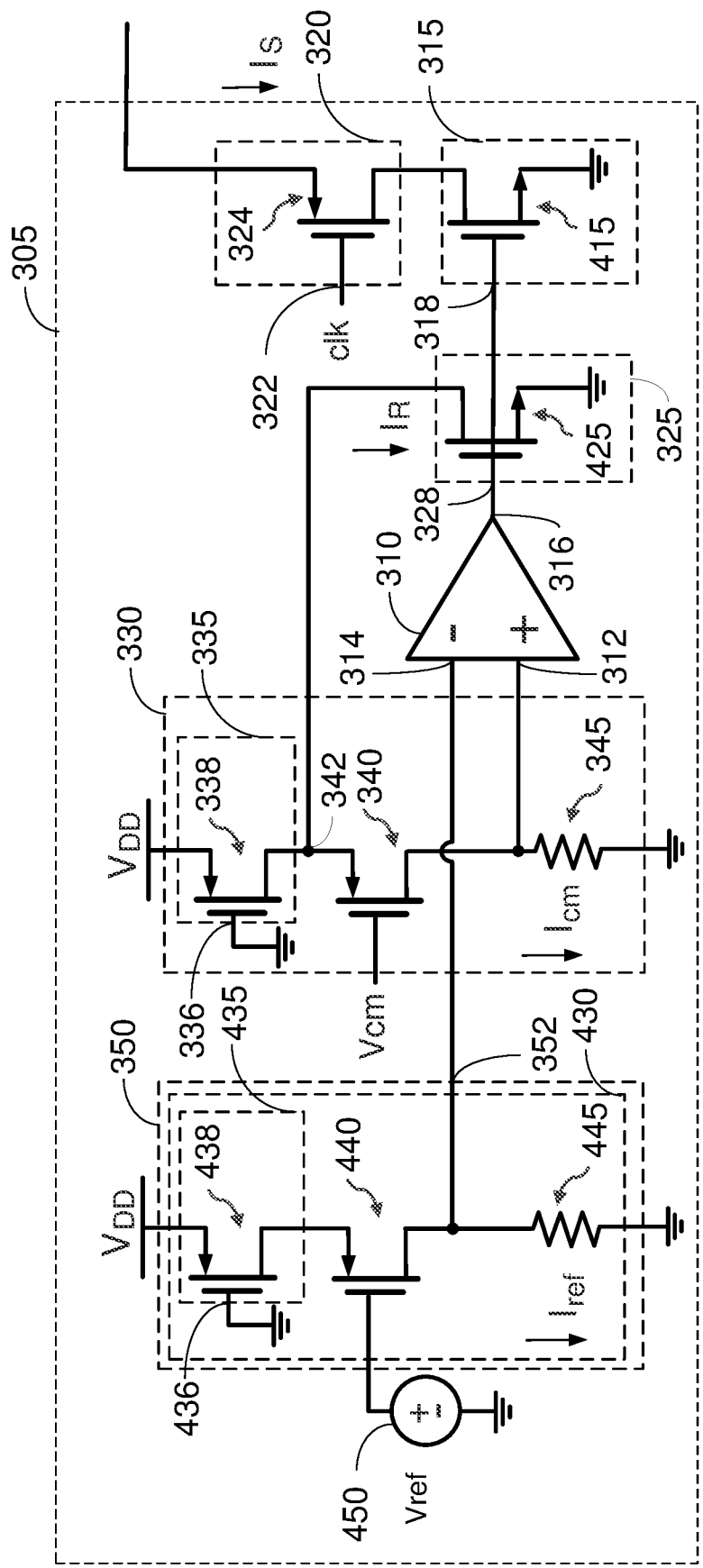
FIG. 4 shows an exemplary implementation of a reference circuit according to certain aspects of the present disclosure.

FIG. 4 shows an exemplary implementation of the first current-control device 315 and the second current-control device 325 according to certain aspects. In this example, the first current-control device 315 includes a first transistor 415 (e.g., NFET). The switch 320 is coupled between the common source node 122 and the drain of the first transistor 415, the gate of the first transistor 415 is coupled to the output 316 of the error amplifier 310, and the source of the first transistor 415 is coupled to the ground. In this example, an output voltage at the output 316 of the error amplifier 310 is applied to the gate of the first transistor 415 and controls the current Is of the first current-control device 315 by controlling the channel conductance of the first transistor 415. In this example, the error amplifier 310 increases the voltage at the output 316 to increase the current Is of the first current-control device 315 and decreases the voltage at the output 316 to decrease the current Is of the first current-control device 315.

In this example, the second current-control device 325 includes a second transistor 425 (e.g., NFET). The drain of the second transistor 425 is coupled to the source node 342 of the replica circuit 330, the gate of the second transistor 425 is coupled to the output 316 of the error amplifier 310, and the source of the second transistor 425 is coupled to the ground. In this example, the output voltage at the output 316 of the error amplifier 310 is applied to the gate of the second transistor 425 and controls the current $I_R$ of the second current-control device 325 by controlling the channel conductance of the second transistor 425. In this example, the error amplifier 310 increases the voltage at the output 316 to increase the current $I_R$ of the second current-control device 325 and decreases the voltage at the output 316 to decrease the $I_R$ of the second current-control device 325.

In this example, the first input 312 of the error amplifier 310 may be a plus input (i.e., non-inverting input) and the second input 314 of the error amplifier 310 may be a minus (i.e., inverting input), as shown in the example in FIG. 4.

It is to be appreciated that the first current-control device 315 and the second current-control device 325 are not limited to the exemplary implementation shown in FIG. 4. For example, in other implementations, each of the current-control devices 315 and 325 may be implemented with another type of transistor or another type of device capable of controlling current flow based on the output signal (e.g., voltage) of the error amplifier 310.

Further, it is to be appreciated that the first current-control device 315 is not limited to pulling current from the common source node 122. For example, in some implementations, the first current-control device 315 may be configured to source current to the common source node 122 in which case the amount of current that is sourced by the first current-control device 315 is controlled by the signal (e.g., output signal of the error amplifier 310) at the control input 318. In this example, the error amplifier 310 may increase the integration current $I_M$ by increasing the amount of current the first current-control device 315 sources to the common source node 122 and decrease the integration current $I_M$ by decreasing the amount of current the first current-control device 315 sources to the common source node 122.

Similarly, in some implementations, the second current-control device 325 may be configured to source current to the source node 342 of the replica circuit 330 in which case the amount of current that is sourced by the second current-control device 325 is controlled by the signal (e.g., output signal of the error amplifier 310) at the control input 328. In this example, the error amplifier 310 may increase the replica current $I_{cm}$ of the replica circuit 330 by increasing the amount of current the second current-control device 325 sources to the source node 342 and decrease the replica current $I_{cm}$ of the replica circuit 330 by decreasing the amount of current the second current-control device 325 sources to the source node 342.

In above example, each of the current-control devices 315 and 325 may be implemented with a respective PFET in which current is sourced from the supply rail. More particularly, the first current-control device 315 may be implemented with a first PFET coupled between the supply rail and the common source node 122 with the gate of the first PFET coupled to the output 316 of the error amplifier 310. In certain aspects, the first PFET and the switch 320 may be coupled in series between the supply rail and the common source node 122. The second current-control device 325 may be implemented with a second PFET coupled between the supply rail and the source node 342 with the gate of the second PFET coupled to the output 316 of the error amplifier 310. Also, in this example, the second input 314 of the error amplifier 310 may be a plus input (i.e., non-inverting input) and the first input 312 of the error amplifier 310 may be a minus (i.e., inverting input).

FIG. 4 also shows an exemplary implementation of the reference circuit 350 according to certain aspects. In this example, the reference circuit 350 includes a second replica circuit 430. In the example shown in FIG. 4, the second replica circuit 430 replicates a branch of the sensing amplifier 110. For example, the second replica circuit 430 may replicate either branch of the sensing amplifier 110.

The second replica circuit 430 includes a switch 435, a fourth input transistor 440, and a current-sensing resistor 445. The switch 435 is coupled between the supply rail $V_{DD}$ and the source of the fourth input transistor 440, and the current-sensing resistor 445 is coupled between the drain of the fourth input transistor 440 and the ground. The switch 435 corresponds to the first switch 115 in the sensing amplifier 110. In the example shown in FIG. 4, the switch 435 is implemented with a PFET 438 that is always turned on by coupling the control input 436 of the switch 435 (and hence the gate of the PFET 438) to the ground. In this example, the output 352 of the reference circuit 350 is coupled between the drain of the fourth input transistor 440 and the current-sensing resistor 445.

The gate of the fourth input transistor 440 is biased by a reference voltage (labeled "Vref"). In certain aspects, the reference voltage is generated by a voltage source 450 coupled to the gate of the fourth input transistor 440. The voltage Vref causes a reference current $I_{ref}$ to flow through the fourth input transistor 440. The reference current $I_{ref}$ flows through the current-sensing resistor 445, which is coupled between the drain of the fourth input transistor 440 and the ground. The current-sensing resistor 445 converts the reference current $I_{ref}$ into the reference signal discussed above. In this example, the reference signal is a voltage approximately equal to the reference current $I_{ref}$ multiplied by the resistance of the current-sensing resistor 445. The reference signal is output at the output 352 of the reference circuit 350, which is coupled to the second input 314 of the error amplifier 310.

In this example, the reference voltage Vref output by the voltage source 450 controls the reference signal and hence the target integration current. Thus, in this example, the reference signal (and hence the target integration current) may be set to a desired value by setting the reference voltage Vref output by the voltage source 450 accordingly. For example, the reference signal (and hence the target integration current) may be increased by decreasing the reference voltage Vref. This is because decreasing the reference voltage Vref increases the reference current $I_{ref}$ flowing through the fourth input transistor 440 (which is implemented with a PFET in this example). The increase in the reference current $I_{ref}$ increases the reference signal, which is approximately equal to the reference current $I_{ref}$ multiplied by the resistance of the current-sensing resistor 445 in this example.

In certain aspects, the voltage source 450 is a programmable voltage source that allows the reference voltage Vref to be programmed to set the reference signal (and hence target integration current). In one example, the voltage source 450 may include a digital-to-analog converter (DAC) configured to receive a digital code and convert the digital code into one of multiple different voltages. In this example, the reference voltage Vref may be programmed to any one of the different voltages by inputting the corresponding digital code to the DAC.

It is to be appreciated that the exemplary implementation of the reference circuit 350 shown in FIG. 4 is not limited to being used with the exemplary implementation of the first current-control device 315 and the exemplary implementation of the second current-control device 325 shown in FIG. 4.

Figure 5:
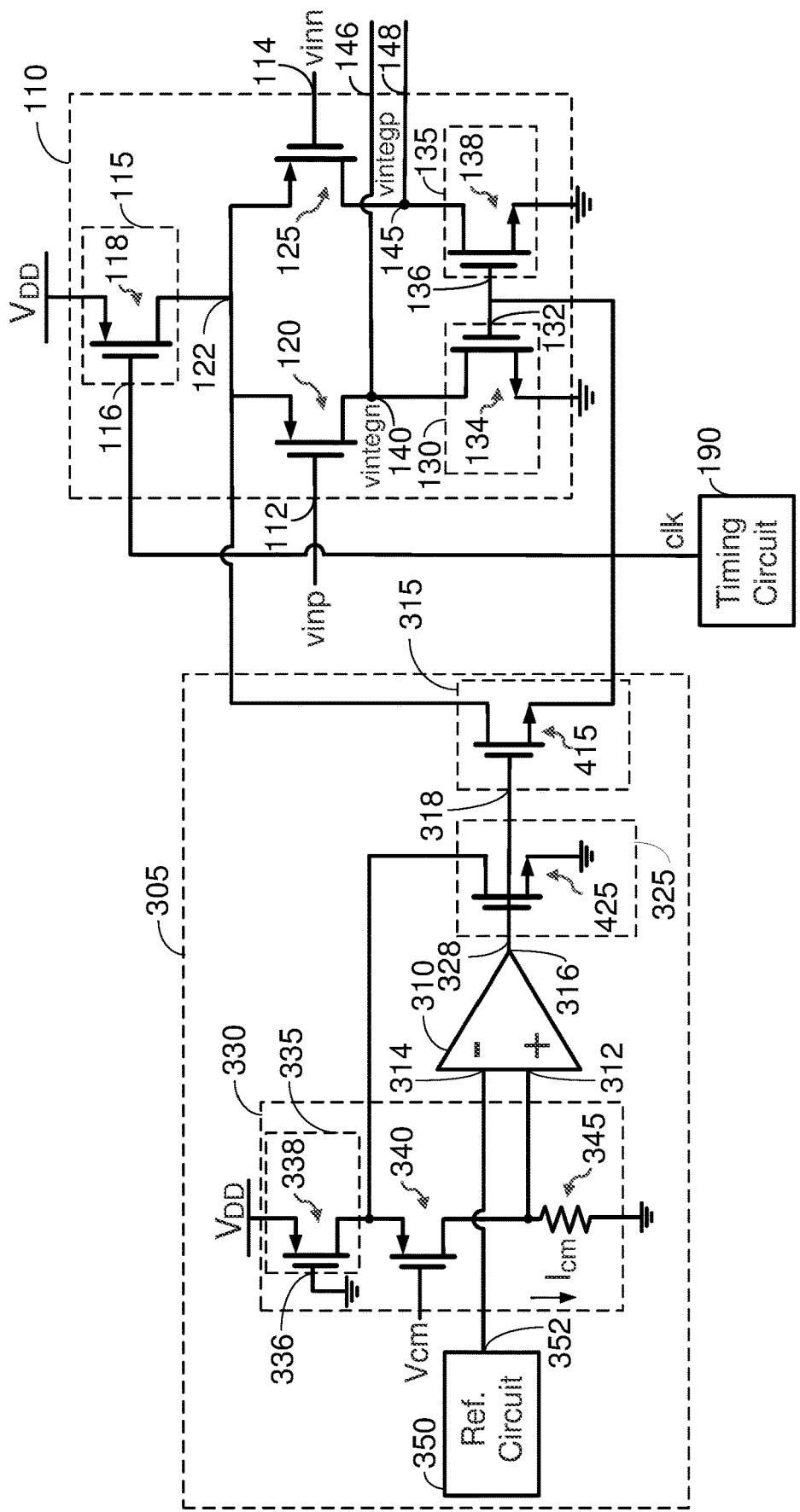
FIG. 5 shows another example of a feedback circuit coupled to the sensing amplifier according to certain aspects of the present disclosure.

FIG. 5 shows an example of the feedback circuit 305 in which the switch 320 is omitted according to certain aspects. In the example shown in FIG. 5, the drain of the first transistor 415 is directly coupled to the common source node 122, and the source of the first transistor 415 is coupled to the timing circuit 190. Since the source of the first transistor 415 is coupled to the timing circuit 190, the clock signal from the timing circuit 190 is applied to the source of the first transistor 415. In this example, the first transistor 415 is implemented with an NFET, and the clock signal is high in the reset phase and low in the integration phase. The high clock signal in the reset phase turns off the first transistor 415 in the reset phase, and the low clock signal in the integration phase turns on the first transistor 415 in the integration phase. Because the first transistor 415 is turned off in the reset phase, the first transistor 415 does not draw current from the common source node 122 in the reset phase. In the exemplary implementation shown in FIG. 4, the first transistor 415 is prevented from drawing current from the common source node 122 in the reset phase by turning off the switch 320 in the reset phase, which decouples the first transistor 415 from the common source node 122 in the reset phase.

Figure 6:
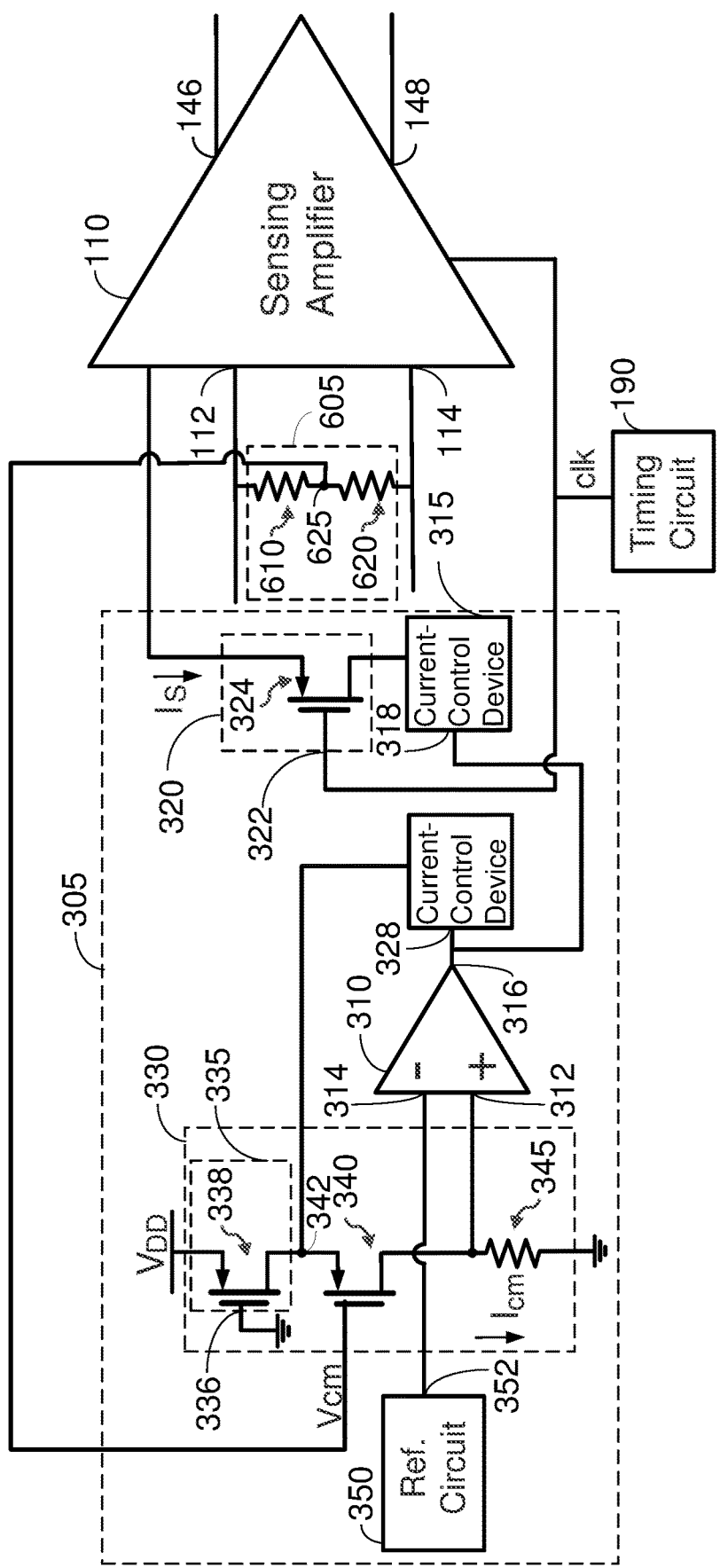
FIG. 6 shows an example of a circuit configured to apply a common mode voltage to a gate of an input transistor according to certain aspects of the present disclosure.

FIG. 6 shows an example of a circuit 605 configured to apply the common mode voltage Vcm to the gate of the third input transistor 340 in the replica circuit 330 according to certain aspects. In this example, the circuit 605 includes a first resistor 610 and a second resistor 620 having approximately equal resistance. The first resistor 610 and the second resistor 620 are coupled in series between the first input 112 and the second input 114 of the sensing amplifier 110, and the gate of the third input transistor 340 is coupled to a node 625 between the first resistor 610 and the second resistor 620.

In this example, the voltage at the node 625 is approximately equal to an average of the voltage at the first input 112 and the voltage at the second input 114 of the sensing amplifier 110. The resulting average voltage at the node 625 is approximately equal to the common mode voltage assuming the input voltage vinp and the input voltage vinn have equal and opposite amplitudes with respect to the common mode voltage Vcm. Thus, in this example, the node 625 provides the gate of the third input transistor 340 with the common mode voltage Vcm. It is to be appreciated that the present disclosure is not limited to this example and that other approaches may be used to apply the common mode voltage to the gate of the third input transistor 340.

Although the switch 320 is shown in the example in FIG. 6, it is to be appreciated that the circuit 605 may also be used in the exemplary implementation shown in FIG. 5, in which the switch 320 is omitted.

Figure 7A:
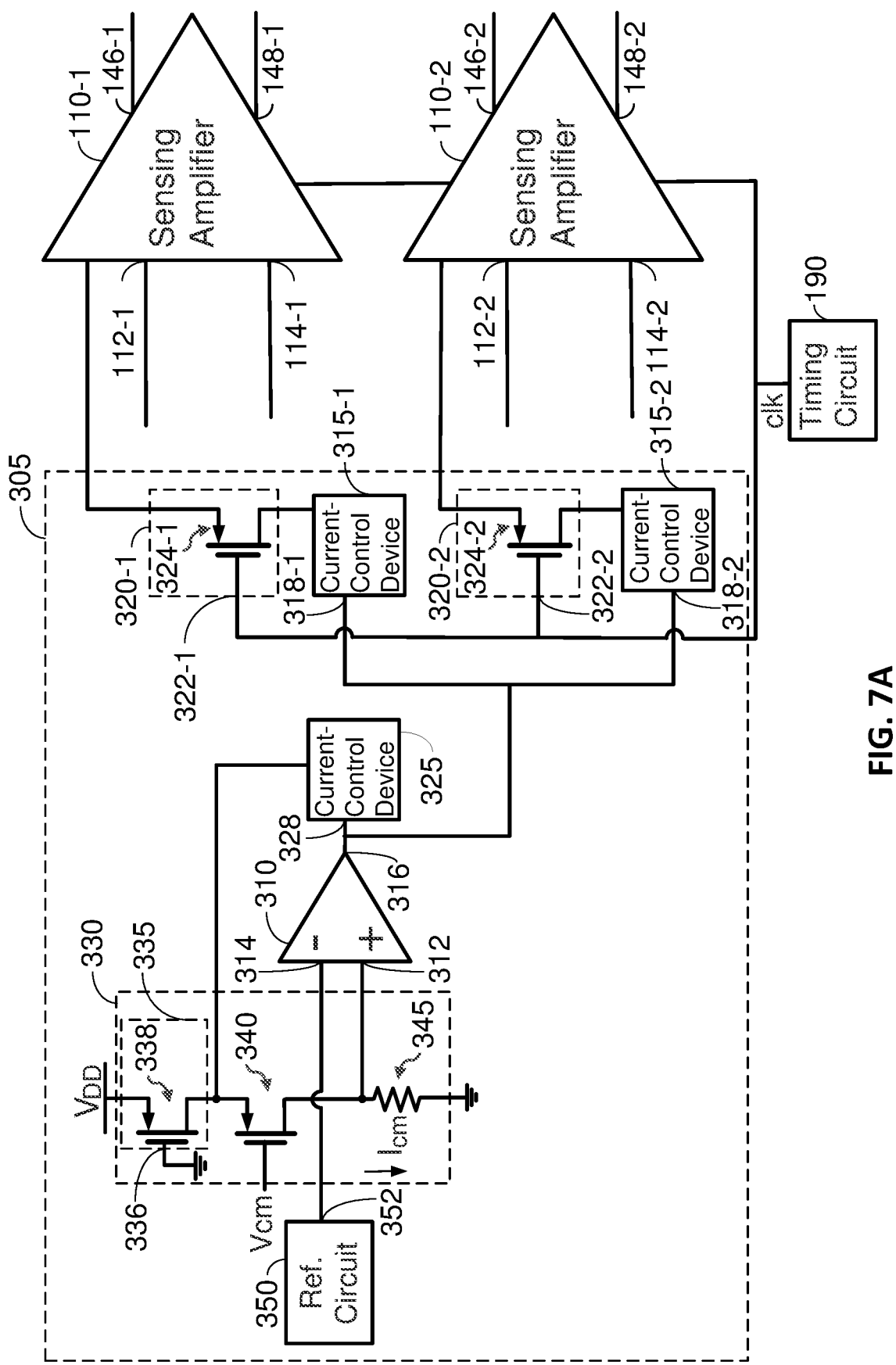
FIG. 7A shows an example of multiple sensing amplifiers coupled to a feedback circuit according to certain aspects of the present disclosure.

Although FIGS. 3, 5, and 6 show examples where the feedback circuit 305 is coupled to one sensing amplifier 110, it is to be appreciated that the feedback circuit 305 is not limited to one sensing amplifier 110. In certain aspects, the feedback circuit 305 may be coupled to multiple sensing amplifiers to regulate the integration current of multiple sensing amplifiers. In this regard, FIG. 7A shows an example in which a first sensing amplifier 110-1 and a second sensing amplifier 110-2 are coupled to the feedback circuit 305. In this example, each of the sensing amplifiers 110-1 and 110-2 may be a copy (i.e., separate instance) of the sensing amplifier 110 discussed above according to various aspects. Thus, the description of the sensing amplifier 110 given above may apply to each of the first sensing amplifier 110-1 and the second sensing amplifier 110-2. In this example, the feedback circuit 305 includes current-control devices 315-1 and 315-2 and switches 320-1 to 320-2, where each of the current-control devices 315-1 to 315-2 is a separate instance of the first current-control device 315 discussed above, and each of the switches 320-1 to 320-2 is a separate instance of the switch 320 discussed above.

In this example, each of the switches 320-1 to 320-2 is coupled between the common source node of a respective one of the first sensing amplifier 110-1 and the second sensing amplifier 110-2 and a respective one of the current-control devices 315-1 and 315-2. The control input 322-1 and 322-2 of each of the switches 320-1 to 320-2 is coupled to the timing circuit 190 and driven by the clock signal. The control input 318-1 and 318-2 of each of the current-control devices 315-1 to 315-2 is coupled to the output 316 of the error amplifier 310. In this example, the feedback circuit 305 uses each of the current-control devices 315-1 and 315-2 to adjust the integration current of the respective one of the first sensing amplifier 110-1 and the second sensing amplifier 110-2 based on the error between the measurement signal and the reference signal.

Figure 7B:
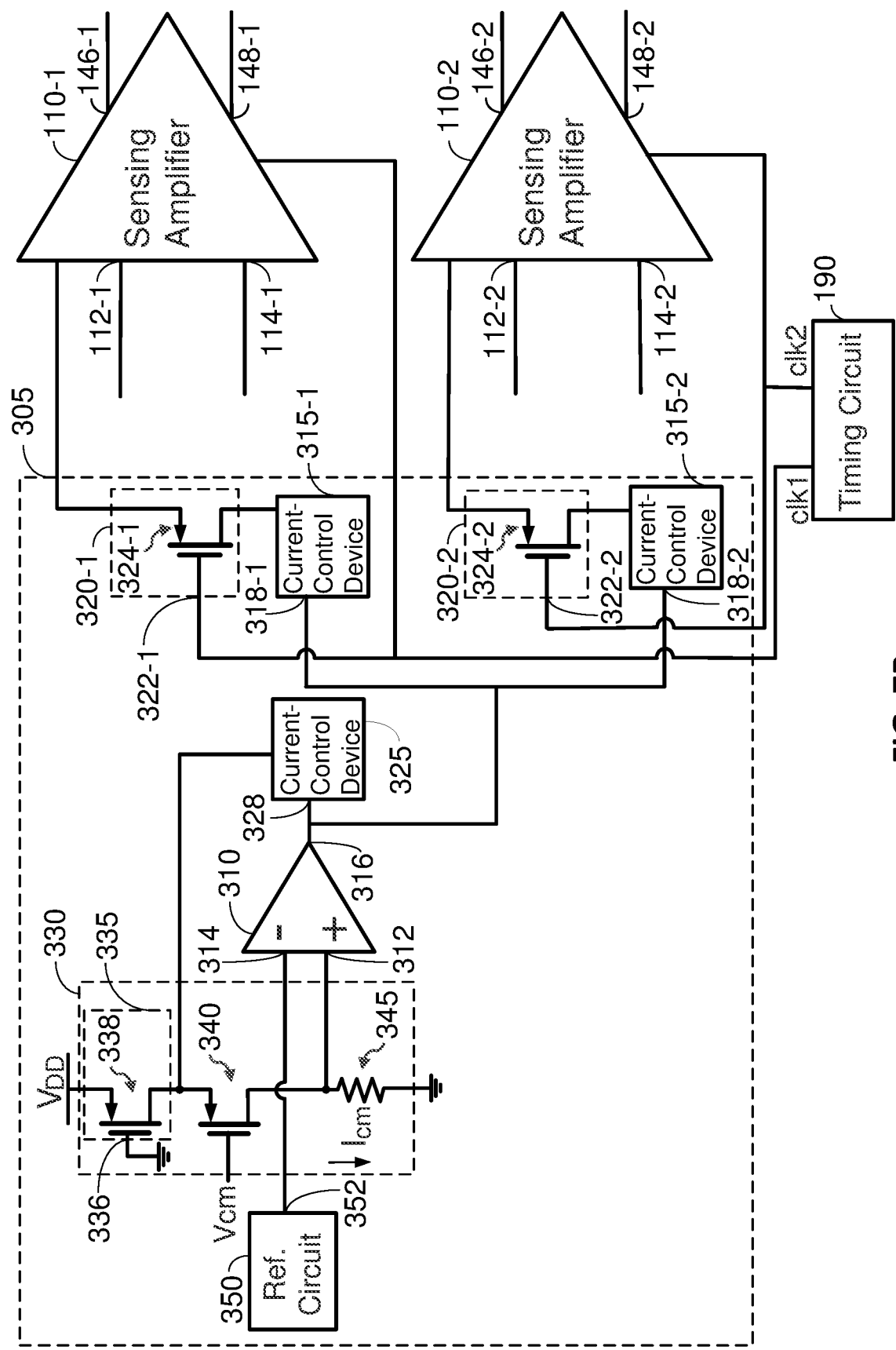
FIG. 7B shows another example of multiple sensing amplifiers coupled to a feedback circuit according to certain aspects of the present disclosure.

Although FIG. 7A shows an example in which the same clock signal is input to the first and second sensing amplifiers 110-1 and 110-2, it is to be appreciated that the present disclosure is not limited to this example. In this regard, FIG. 7B shows an example in which a first clock signal clk1 is input to the first sensing amplifier 110-1 and a second clock signal clk2 is input to the second sensing amplifier 110-2. More particularly, the first clock signal clk1 is used to clock the switches in the first sensing amplifier 110-1 (e.g., the respective switches 115, 130, and 135 in the first sensing amplifier 110-1), and the second clock signal clk2 is used to clock the switches in the second sensing amplifier 110-2 (e.g., the respective switches 115, 130, and 135 in the second sensing amplifier 110-2).

Figure 7C:
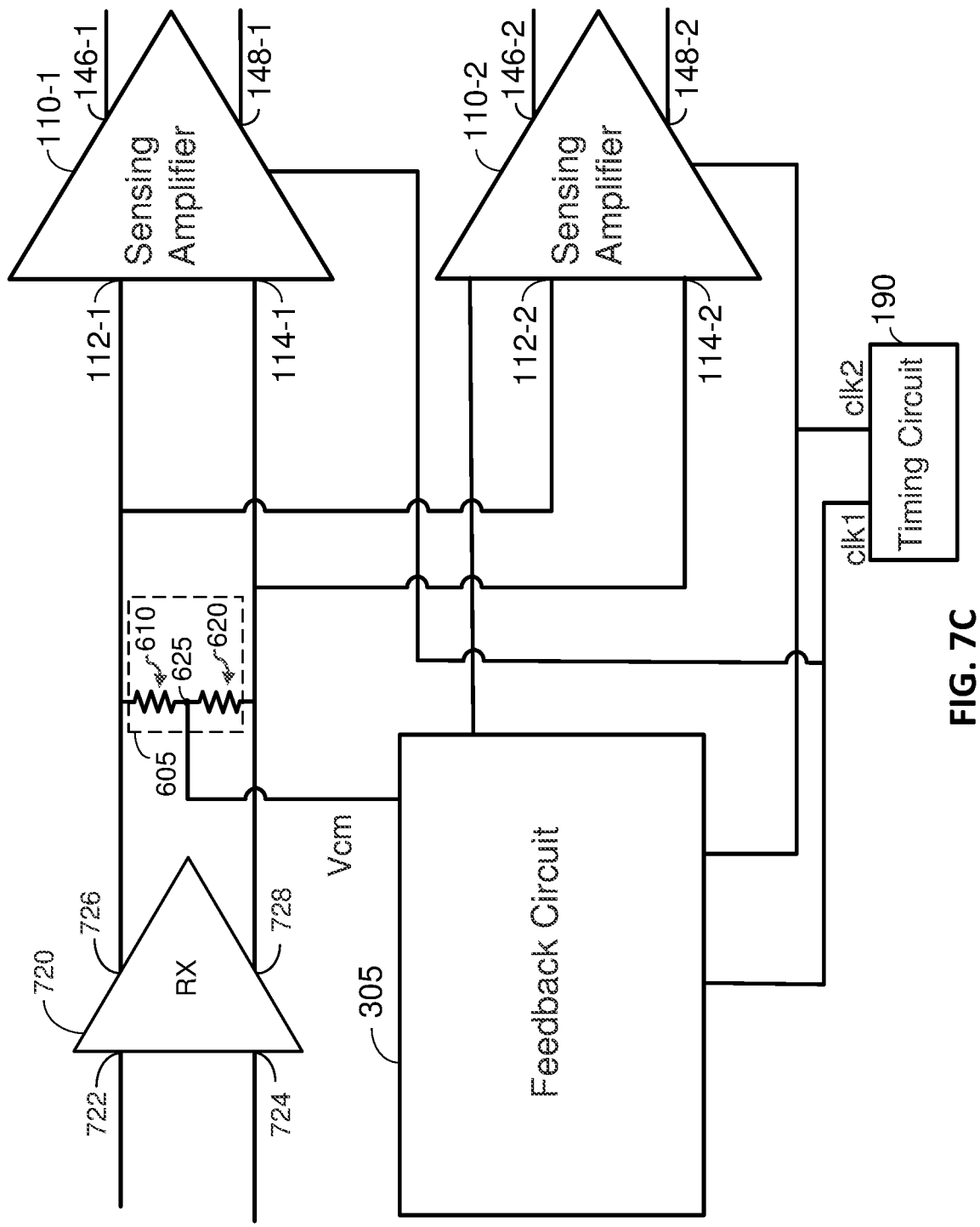
FIG. 7C shows an example of a receiver coupled to multiple sensing amplifiers according to certain aspects of the present disclosure.

In this example, the first clock signal clk1 is input to the control input 322-1 of switch 320-1 and the second clock signal clk2 is input to the control input 322-2 of switch 320-2. In one example, the second clock signal clk2 may be the complement (i.e., inverse) of the first clock signal clk. In this example, the first sensing amplifier 110-1 and the second sensing amplifier 110-2 be coupled to the same data channel and may be used to receive alternating data bits from the data channel. In this regard, FIG. 7C shows an example in which the first sensing amplifier 110-1 and the second sensing amplifier 110-2 are coupled to a receiver 720. In this example, the receiver 720 has a first input 722, a second input 724, a first output 726, and a second output 728. The first output 726 of the receiver 720 is coupled to the first input 112-1 of the first sensing amplifier 110-1 and the first input 112-2 of the second sensing amplifier 110-2. The second output 728 of the receiver 720 is coupled to the second input 114-1 of the first sensing amplifier 110-1 and the second input 114-2 of the second sensing amplifier 110-2. The receiver 720 may include at least one of an amplifier and an equalizer.

In operation, the receiver 720 is configured to receive an input differential signal at the first input 722 and second input 724 (e.g., from a differential serial link). The receiver 720 may amplify and/or equalize the input differential signal into a differential voltage including the input voltage vinp and the input voltage vinn discussed above, and output the input voltage vinp and the input voltage vinn at the first output 726 and the second output 728, respectively. In one example, the differential voltage may carry data bits at a data rate equal to twice the frequency of the clock signals clk1 and clk2 (i.e., the data rate may be a double data rate with respect to the clock signal clk1 and clk2). In this example, the first sensing amplifier 110-1 may be configured to receive odd data bits using the first clock signal clk1 and the second sensing amplifier 110-2 may be configured to receive even data bits using the second clock signal clk2, or vice versa.

In the example in FIG. 7C, the common mode voltage Vcm may be obtained using the exemplary circuit 605. In this example, the circuit 605 is coupled between the first output 726 and the second output 728 of the receiver 720, and the common mode voltage Vcm is provided at the node 625 between the first resistor 610 and the second resistor 620. The node 625 may be coupled to the gate of the third input transistor 340 in the replica circuit 330 (shown in FIG. 7B).

It is to be appreciated that the first clock signal clk and the second clock signal clk2 are not limited to the above example. In general, the first clock signal clk1 and the second clock signal clk2 may have the same frequency but may be offset from each other by a phase (e.g., a phase of 180 degrees, a phase of 90 degrees, etc.).

Although two sensing amplifiers 110-1 and 110-2 are shown in the examples in FIG. 7A and FIG. 7B, it is to be appreciated that the feedback circuit 305 may be extended to regulate the integration current of three or more sensing amplifiers. Thus, one feedback circuit may be used to regulate the integration current of multiple sensing amplifiers.

Figure 8:
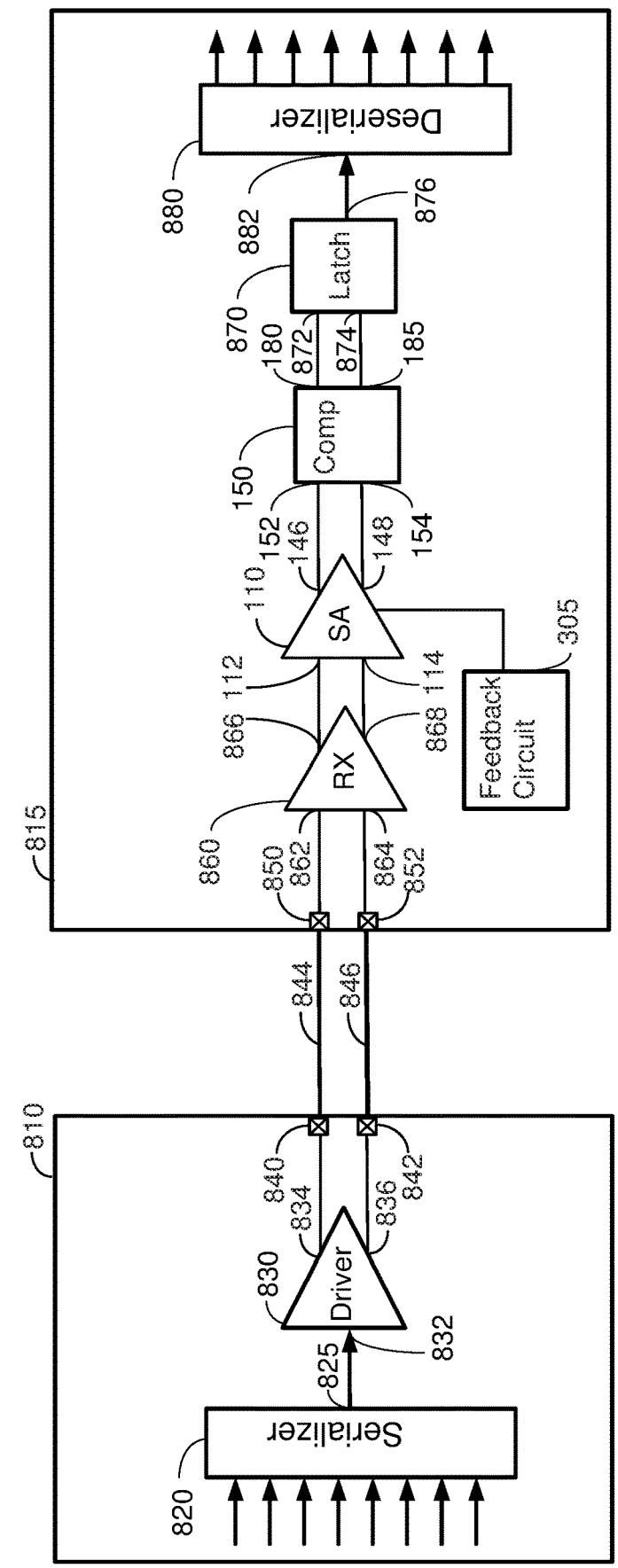
FIG. 8 shows an example of a system in which aspects of the present disclosure may be used according to certain aspects of the present disclosure.

FIG. 8 shows an example of a system 805 in which aspects of the present disclosure may be used. In this example, the system 805 includes a first chip 810 and a second chip 815 in which SerDes may be used for communication between the first chip 810 and the second chip 815. The first chip 810 includes a serializer 820, a driver 830, a first output pin 840, and a second output pin 842. The second chip 815 includes a first receive pin 850, a second receive pin 852, a receiver 860, the sensing amplifier 110, the comparator 150, a latch 870, and a deserializer 880.

In this example, the first chip 810 and the second chip 815 are coupled via a differential serial link including a first line 844 and a second line 846. The first line 844 is coupled between the first output pin 840 and the first receive pin 850, and the second line 846 is coupled between the second output pin 842 and the second receive pin 852. Each one of the first line 844 and the second line 846 may be implemented with a metal line on a substrate (e.g., a printed circuit board), a wire, etc.

On the first chip 810, the serializer 820 is configured to receive parallel data streams (e.g., from a processor on the first chip 810) and convert the parallel data streams into a serial data stream, which is output at an output 825 of the serializer 820. The driver 830 has an input 832 coupled to the output 825 of the serializer 820, a first output 834 coupled to the first output pin 840, and a second output 836 coupled to the second output pin 842. The driver 830 is configured to receive the serial data stream, convert the serial data stream into a differential signal, and drive the first line 844 and the second line 846 of the differential serial link with the differential signal to transmit the differential signal to the second chip 815. It is to be appreciated that the first chip 810 may include additional components not shown in FIG. 8 (e.g., impedance matching network coupled to the first output pin 840 and/or the second output pin 842, a pre-driver coupled between the serializer 820 and the driver 830, etc.).

On the second chip 815, the receiver 860 (e.g., the receiver 720) has a first input 862 coupled to the first receive pin 850, a second input 864 coupled to the second receive pin 852, a first output 866 coupled to the first input 112 of the sensing amplifier 110, and a second output 868 coupled to the second input 114 of the sensing amplifier 110. The receiver 860 may include at least one of an amplifier and an equalizer (e.g., to compensate for frequency-dependent signal attenuation between the first chip 810 and the second chip 815). The sensing amplifier 110 receives the differential input voltage from the receiver 860. As discussed above, the differential input voltage includes the input voltage vinp and input voltage vinn. The receiver 860 may also bias each of the inputs 112 and 114 with the common mode voltage Vcm. The first output 146 and the second output 148 of the sensing amplifier 110 are coupled to the first input 152 and the second input 154, respectively, of the comparator 150. The comparator 150 outputs a resolved bit at the first output 180 and the complement of the resolved bit at the second output 185, as discussed above. The second chip 815 may also include the feedback circuit 305 coupled to the sensing amplifier 110 to regulate the integration current of the sensing amplifier 110, as discussed above.

In the example in FIG. 8, the first output 180 of the comparator 150 is coupled to a first input 872 of the latch 870, and the second output 185 of the comparator 150 is coupled to a second input 874 of the latch 870. The latch 870 has an output 876 coupled to an input 882 of the deserializer 880. The latch 870 (e.g., an SR latch or another type of latch) is configured to latch bit decisions from the comparator 150 and output the latched bits to the deserializer 880. The deserializer 880 is configured to convert the bits into parallel data streams, which may be output to one or more components (not shown) on the second chip 815 for further processing. It is to be appreciated that the second chip 815 may include additional components not shown in FIG. 8 (e.g., impedance matching network coupled to the first receive pin 850 and/or the second receive pin 852, clock-recovery circuit, etc.).

Figure 9:
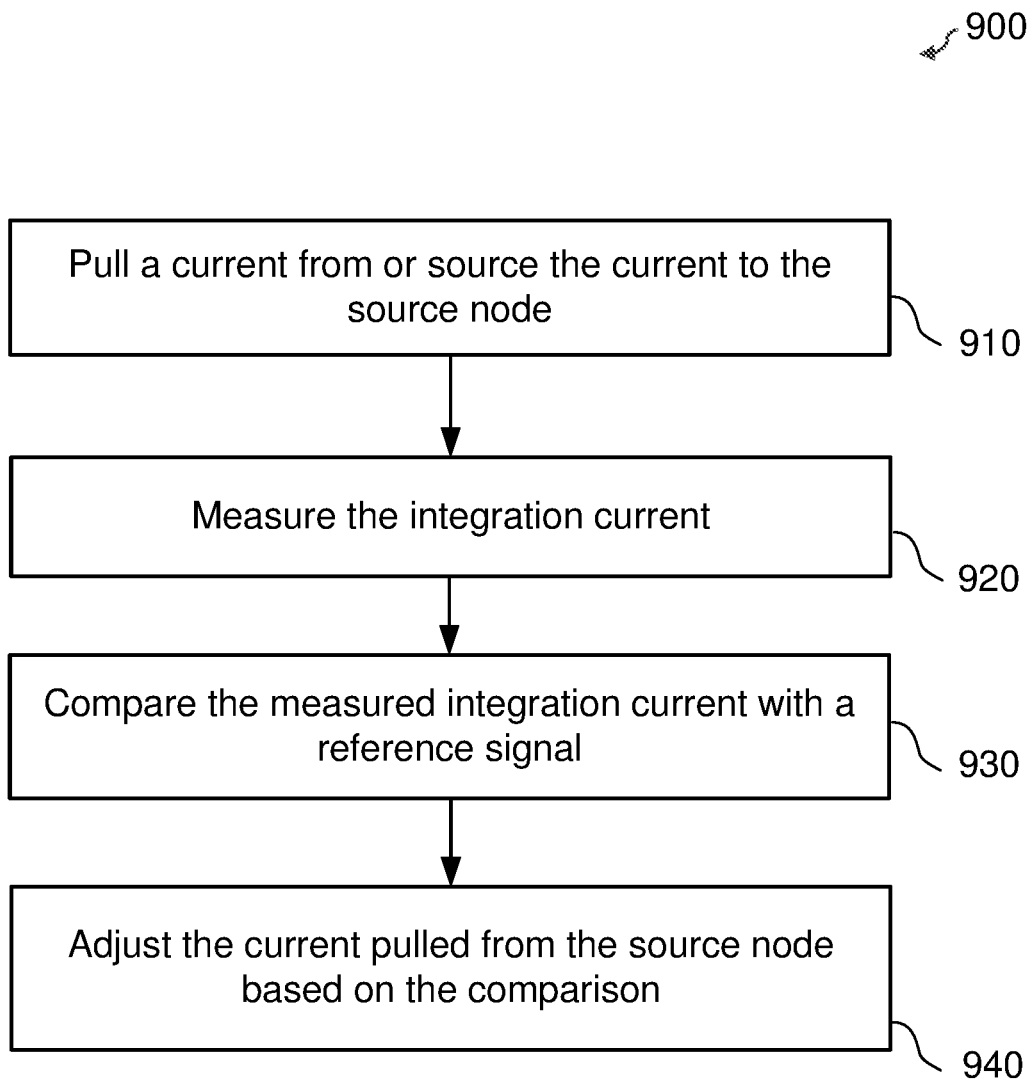
FIG. 9 is a flowchart illustrating an exemplary method for regulating an integration current of a sensing amplifier according to certain aspects of the present disclosure.

FIG. 9 illustrates a method 900 for regulating an integration current of a sensing amplifier according to certain aspects. The sensing amplifier (e.g., sensing amplifier 110) includes a first input transistor (e.g., first input transistor 120) and a second input transistor (e.g., second input transistor 125), wherein a source of the first input transistor and a source of the second input transistor are coupled to a source node (e.g., common source node 122).

At block 910, a current is pulled from or sourced to the source node. For example, the current (e.g., current Is) may be pulled from or sourced to the source node by the first current-control device 315.

At block 920, the integration current is measured. For example, the integration current may be measured indirectly using a replica circuit (e.g., replica circuit 330). In this example, measuring the integration current may include generating a replica current (e.g., replica current $I_{cm}$) that is proportional to the integration current using the replica circuit and generating a measurement signal based on the replica current.

At block 930, the measured integration current is compared with a reference signal. For example, the error amplifier 310 may compare the measured integration current (e.g., measurement signal) with the reference signal. The reference signal may be generated by the reference circuit 350.

At block 940, the current pulled from or sourced to the source node is adjusted based on the comparison. For example, the current pulled from or sourced to the source node may be adjusted by the error amplifier 310 and the first current-control device 315. In this example, the error amplifier 310 may adjust the current pulled from or sourced to the source node by adjusting an output signal (e.g., voltage) of the error amplifier 310 based on the comparison, in which the output signal is input to the control input 318 of the first current-control device 315. In certain aspects, adjusting the current pulled from or sourced to the source node includes adjusting the current pulled from or sourced to the source node in a direction that reduces a difference between the measured integration current (e.g., measurement signal) and the reference signal.

It is to be appreciated that the present disclosure is not limited to the exemplary terminology used above to describe aspects of the present disclosure.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element. Also, it is to be understand that numerical designations used to distinguish elements (e.g., transistors) in the description do not necessarily match numerical designations used for corresponding elements (e.g., transistors) in the claims.

It is to be appreciated that the first input transistor 120, the second input transistor 125, the third input transistor 340, and the fourth input transistor 440 may be referred to simply as a first transistor, a second transistor, a third transistor, and a fourth transistor, respectively. In this example, the first transistor 415 and the second transistor 425 may be referred to as a fifth transistor and a sixth transistor, respectively, or referred to using other numerical designations. In another example, the first transistor 415 may be referred to as a first current-control transistor and the second transistor 425 may be referred to as a second current-control transistor.

Implementation examples are described in the following numbered clauses:

1. An apparatus, comprising:
    an error amplifier having a first input, a second input, and an output;
    a sensing amplifier including a first transistor and a second transistor, wherein a source of the first transistor and a source of the second transistor are coupled to a common source node;
    a first current-control device coupled to the common source node, wherein the first current-control device has a control input coupled to the output of the error amplifier;
    a replica circuit coupled to the first input of the error amplifier, wherein the replica circuit includes a third transistor replicating one of the first transistor and the second transistor;
    a second current-control device coupled to a source of the third transistor, wherein the second current-control device has a control input coupled to the output of the error amplifier; and
    a reference circuit coupled to the second input of the error amplifier, wherein the reference circuit is configured to output a reference signal.

2. The apparatus of clause 1, wherein the replica circuit comprises:
    a switch coupled between a supply rail and the third transistor; and
    a resistor coupled between the third transistor and a ground, wherein the first input of the error amplifier is coupled between the third transistor and the resistor.

3. The apparatus of clause 2, wherein the switch comprises a p-type field effect transistor (PFET) having a gate coupled to the ground.

4. The apparatus of clause 2 or 3, wherein the third transistor comprises a p-type field effect transistor (PFET).

5. The apparatus of any one of clauses 2 to 4, wherein a gate of the third transistor is biased by a common mode voltage of the sensing amplifier.

6. The apparatus of any one of clauses 1 to 5, wherein the reference circuit comprises:
    a fourth transistor having a gate coupled to a voltage source;
    a switch coupled between a supply rail and the fourth transistor; and
    a resistor coupled between the fourth transistor and a ground, wherein the second input of the error amplifier is coupled between the fourth transistor and the resistor.

7. The apparatus of clause 6, wherein the switch comprises a p-type field effect transistor (PFET) having a gate coupled to the ground.

8. The apparatus of clause 6 or 7, wherein the fourth transistor comprises a p-type field effect transistor (PFET).

9. The apparatus of any one of clauses 6 to 8, wherein the voltage source comprises a digital-to-analog converter.

10. The apparatus of any one of clauses 1 to 9, further comprising a switch coupled between the first current-control device and the common source node, wherein a control input of the switch is coupled to a timing circuit.

11. The apparatus of clause 10, wherein the timing circuit is configured to drive the control input of the switch with a clock signal.
12. The apparatus of any one of clauses 1 to 9, wherein the first current-control device comprises a fourth transistor having a gate coupled to the output of the error amplifier.
13. The apparatus of clause 12, wherein a drain of the fourth transistor is coupled to the common source node, and a source of the fourth transistor is coupled to a timing circuit.
14. The apparatus of clause 13, wherein the timing circuit is configured to drive the source of the fourth transistor with a clock signal.
15. The apparatus of any one of clauses 1 to 14, wherein the first current-control device is configured to:
pull a current from or source a current to the common source node;
receive an output signal from the output of the error amplifier at the control input of the first current-control device; and
adjust the current pulled from or sourced to the common source node based on the received output signal.
16. The apparatus of any one of clauses 1 to 15, wherein:
the first current-control device comprises a fourth transistor having a gate coupled to the output of the error amplifier; and
the second current-control device comprises a fifth transistor having a gate coupled to the output of the error amplifier.
17. The apparatus of clause 16, wherein each of the fourth transistor and the fifth transistor comprises a respective n-type field effect transistor (NFET).
18. The apparatus of clause 16, wherein each of the fourth transistor and the fifth transistor comprises a respective p-type field effect transistor (PFET).
19. The apparatus of any one of clauses 1 to 18, wherein:
the first transistor has a gate coupled to a first input of the sensing amplifier;
the second transistor has a gate coupled to a second input of the sensing amplifier; and
the first input of the sensing amplifier is configured to receive a first input voltage and the second input of the sensing amplifier is configured to receive a second input voltage.
20. The apparatus of clause 19, wherein:
the first transistor has a drain coupled to a first output of the sensing amplifier; and
the second transistor has a drain coupled to a second output of the sensing amplifier.
21. The apparatus of clause 20, further comprising a comparator having a first input and a second input, wherein the first input of the comparator is coupled to the first output of the sensing amplifier and the second input of the comparator is coupled to the second output of the sensing amplifier.
22. The apparatus of any one of clauses 1 to 21, further comprising a receiver coupled to the sensing amplifier.
23. The apparatus of any one of clauses 1 to 22, further comprising a comparator coupled to the sensing amplifier.
24. The apparatus of clause 23, further comprising:
a latch coupled to the comparator; and
a deserializer coupled to the latch.
25. A method for regulating an integration current of a sensing amplifier, the sensing amplifier including a first input transistor and a second input transistor, wherein a source of the first input transistor and a source of the second input transistor are coupled to a source node, the method comprising:
pulling a current from or sourcing the current to the source node;
measuring the integration current;
comparing the measured integration current with a reference signal; and
adjusting the current pulled from or sourced to the source node based on the comparison.
26. The method of clause 25, wherein adjusting the current pulled from or sourced to the source node comprises adjusting the current pulled from or sourced to the source node in a direction that reduces a difference between the measured integration current and the reference signal.
27. The method of clause 25 or 26, wherein measuring the integration current comprises:
generating a replica current that is proportional to the integration current; and
generating a measurement signal based on the replica current.
28. The method of clause 27, wherein comparing the measured integration current with the reference signal comprises comparing the measurement signal with the reference signal.
29. The method of clause 28, wherein adjusting the current pulled from or sourced to the source node comprises adjusting the current pulled from or sourced to the source node in a direction that reduces a difference between the measurement signal and the reference signal.
30. The method of any one of clauses 27 to 29, wherein generating the measurement signal comprises passing the replica current through a resistor.
31. An apparatus, comprising:
an error amplifier having a first input, a second input, and an output;
a sensing amplifier including a first input transistor and a second input transistor, wherein a source of the first input transistor and a source of the second input transistor are coupled to a common source node, and wherein an integration current flows from a supply rail to the common source node;
a first current-control device coupled to the common source node to regulate the integration current, wherein the first current-control device has a control input coupled to the output of the error amplifier;
a replica circuit configured to generate a replica current that tracks the integration current and configured to couple the replica current to the first input of the error amplifier, wherein the replica circuit includes a third input transistor replicating one of the first input transistor and the second input transistor;
a second current-control device coupled to a source of the third input transistor, wherein the second current-control device has a control input coupled to the output of the error amplifier; and
a reference circuit coupled to the second input of the error amplifier, wherein the reference circuit is configured to output a reference signal to the second input of the error amplifier.
32. The apparatus of clause 31, wherein the replica circuit comprises:
a switch coupled between the supply rail and the third input transistor; and a resistor coupled between the third input transistor and a ground, wherein the first input of the error amplifier is coupled between the third input transistor and the resistor.

33. The apparatus of clause 32, wherein the switch comprises a p-type field effect transistor (PFET) having a gate coupled to the ground.
34. The apparatus of clause 32 or 33, wherein the third input transistor comprises a p-type field effect transistor (PFET).
35. The apparatus of any one of clauses 32 to 34, wherein a gate of the third input transistor is biased by a common mode voltage of the sensing amplifier.
36. The apparatus of clause 35, further comprising a first resistor and a second resistor coupled in series between a first input and a second input of the sensing amplifier, wherein the gate of the third input transistor is coupled to a node between the first resistor and the second resistor, the first input of the sensing amplifier is coupled to a gate of the first input transistor, and the second input of the sensing amplifier is coupled to a gate of the second input transistor.
37. The apparatus of any one of clauses 31 to 36, wherein the reference circuit comprises:
a fourth input transistor having a gate coupled to a voltage source;
a switch coupled between the supply rail and the fourth input transistor; and
a resistor coupled between the fourth input transistor and a ground, wherein the second input of the error amplifier is coupled between the fourth input transistor and the resistor.
38. The apparatus of clause 37, wherein the switch comprises a p-type field effect transistor (PFET) having a gate coupled to the ground.
39. The apparatus of clause 37 or 38, wherein the fourth input transistor comprises a p-type field effect transistor (PFET).
40. The apparatus of any one of clauses 37 to 39, wherein the voltage source comprises a digital-to-analog converter.
41. The apparatus of any one of clauses 31 to 40, further comprising a switch coupled between the first current-control device and the common source node, wherein a control input of the switch is coupled to a timing circuit.
42. The apparatus of clause 41, wherein the timing circuit is configured to drive the control input of the switch with a clock signal.
43. The apparatus of any one of clauses 31 to 40, wherein the first current-control device comprises a current-control transistor having a gate coupled to the output of the error amplifier.
44. The apparatus of clause 43, wherein a drain of the current-control transistor is coupled to the common source node, and a source of the current-control transistor is coupled to a timing circuit.
45. The apparatus of clause 44, wherein the timing circuit is configured to drive the source of the current-control transistor with a clock signal.
46. The apparatus of any one of clauses 31 to 45, wherein the first current-control device is configured to:
pull a current from or source a current to the common source node;
receive an output signal from the output of the error amplifier at the control input of the first current-control device; and
adjust the current pulled from or sourced to the common source node based on the received output signal.

47. The apparatus of any one of clauses 31 to 46, wherein:
the first current-control device comprises a first current-control transistor having a gate coupled to the output of the error amplifier; and
the second current-control device comprises a second current-control transistor having a gate coupled to the output of the error amplifier.
48. The apparatus of clause 47, wherein each of the first current-control transistor and the second current-control transistor comprises a respective n-type field effect transistor (NFET).
49. The apparatus of clause 46, wherein each of the first current-control transistor and the second current-control transistor comprises a respective p-type field effect transistor (PFET).
50. The apparatus of any one of clauses 31 to 49, wherein:
the first input transistor has a gate coupled to a first input of the sensing amplifier;
the second input transistor has a gate coupled to a second input of the sensing amplifier; and
the first input of the sensing amplifier is configured to receive a first input voltage and the second input of the sensing amplifier is configured to receive a second input voltage.
51. The apparatus of clause 50, wherein:
the first input transistor has a drain coupled to a first output of the sensing amplifier; and
the second input transistor has a drain coupled to a second output of the sensing amplifier.
52. The apparatus of clause 51, further comprising a comparator having a first input and a second input, wherein the first input of the comparator is coupled to the first output of the sensing amplifier and the second input of the comparator is coupled to the second output of the sensing amplifier.
53. The apparatus of any one of clauses 31 to 52, further comprising a receiver coupled to the sensing amplifier.
54. The apparatus of any one of clauses 31 to 53, further comprising a comparator coupled to the sensing amplifier.
55. The apparatus of clause 54, further comprising:
a latch coupled to the comparator; and
a deserializer coupled to the latch.
56. A method for regulating an integration current of a sensing amplifier, the sensing amplifier including a first input transistor and a second input transistor, wherein a source of the first input transistor and a source of the second input transistor are coupled to a source node, and the integration current flows from a supply rail to the source node, the method comprising:
pulling a current from or sourcing the current to the source node by means of a current control device;
measuring the integration current in a replica circuit;
comparing the measured integration current with a reference signal in an error amplifier; and
adjusting the current pulled from or sourced to the source node by means of the current control device based on the comparison.
57. The method of clause 56, wherein adjusting the current pulled from or sourced to the source node comprises adjusting the current pulled from or sourced to the source node in a direction that reduces a difference between the measured integration current and the reference signal.
58. The method of clause 56 or 57, wherein measuring the integration current in the replica circuit comprises:

generating a replica current that is proportional to the integration current; and generating a measurement signal based on the replica current.

59. The method of clause 58, wherein comparing the measured integration current with the reference signal in the error amplifier comprises comparing the measurement signal with the reference signal.

60. The method of clause 59, wherein adjusting the current pulled from or sourced to the source node by means of the current control device comprises adjusting the current pulled from or sourced to the source node in a direction that reduces a difference between the measurement signal and the reference signal.

61. The method of any one of clauses 58 to 60, wherein generating the measurement signal comprises passing the replica current through a resistor.

62. The method of clause 58, wherein generating the replica current comprises generating the replica current by means of a third input transistor having a gate receiving a common mode voltage of the sense amplifier.

63. The method of clause 27, wherein generating the replica current comprises generating the replica current using a third input transistor having a gate receiving a common mode voltage of the sense amplifier.

64. An apparatus, comprising:
a sensing amplifier including a first transistor and a second transistor, wherein a source of the first transistor and a source of the second transistor are coupled to a common source node, and wherein an integration current flows from a supply rail to the common source node; and
a feedback circuit configured to:
pull a current from or source the current to the common source node;
measure the integration current;
compare the measured integration current with a reference signal; and
adjust the current pulled from or sourced to the source node based on the comparison.

65. The apparatus of clause 64, wherein the feedback circuit is configured to adjust the current pulled from or sourced to the source node in a direction that reduces a difference between the measured integration current and the reference signal.

66. The apparatus of clause 64 or 65, wherein:
the first transistor has a gate coupled to a first input of the sensing amplifier;
the second transistor has a gate coupled to a second input of the sensing amplifier; and
the first input of the sensing amplifier is configured to receive a first input voltage and the second input of the sensing amplifier is configured to receive a second input voltage.

67. The apparatus of clause 66, wherein:
the first transistor has a drain coupled to a first output of the sensing amplifier; and
the second transistor has a drain coupled to a second output of the sensing amplifier.

68. The apparatus of clause 67, further comprising a comparator having a first input and a second input, wherein the first input of the comparator is coupled to the first output of the sensing amplifier and the second input of the comparator is coupled to the second output of the sensing amplifier.

69. The apparatus of any one of clauses 64 to 68, wherein:
the feedback circuit comprises a third transistor configured to generate a replica current that is proportional to the integration current; and
the feedback circuit is configured to measure the integration current based on the replica current.

70. The apparatus of clause 69, wherein a gate of the third transistor is configured to receive a common mode voltage of the sense amplifier.

71. The apparatus of clause 70, further comprising a first resistor and a second resistor coupled in series between a gate of the first transistor and a gate of the second transistor, wherein the gate of the third transistor is coupled to a node between the first resistor and the second resistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
an error amplifier having a first input, a second input, and an output;
a sensing amplifier including a first transistor and a second transistor, wherein a source of the first transistor and a source of the second transistor are coupled to a common source node;
a first current-control device coupled to the common source node, wherein the first current-control device has a control input coupled to the output of the error amplifier;
a replica circuit coupled to the first input of the error amplifier, wherein the replica circuit includes a third transistor replicating one of the first transistor and the second transistor;
a second current-control device coupled to a source of the third transistor, wherein the second current-control device has a control input coupled to the output of the error amplifier;
a reference circuit coupled to the second input of the error amplifier, wherein the reference circuit is configured to output a reference signal; and
a switch coupled between the first current-control device and the common source node, wherein a control input of the switch is coupled to a timing circuit.

2. The apparatus of claim 1, wherein the replica circuit comprises:
a switch coupled between a supply rail and the third transistor; and a resistor coupled between the third transistor and a ground, wherein the first input of the error amplifier is coupled between the third transistor and the resistor.

3. The apparatus of claim 2, wherein the switch comprises a p-type field effect transistor (PFET) having a gate coupled to the ground.

4. The apparatus of claim 2, wherein the third transistor comprises a p-type field effect transistor (PFET).

5. The apparatus of claim 2, wherein a gate of the third transistor is biased by a common mode voltage of the sensing amplifier.

6. The apparatus of claim 1, wherein the reference circuit comprises:
    a fourth transistor having a gate coupled to a voltage source;
    a switch coupled between a supply rail and the fourth transistor; and
    a resistor coupled between the fourth transistor and a ground, wherein the second input of the error amplifier is coupled between the fourth transistor and the resistor.

7. The apparatus of claim 6, wherein the switch comprises a p-type field effect transistor (PFET) having a gate coupled to the ground.

8. The apparatus of claim 6, wherein the fourth transistor comprises a p-type field effect transistor (PFET).

9. The apparatus of claim 6, wherein the voltage source comprises a digital-to-analog converter.

10. The apparatus of claim 1, wherein the timing circuit is configured to drive the control input of the switch with a clock signal.

11. The apparatus of claim 1, wherein the first current-control device comprises a fourth transistor having a gate coupled to the output of the error amplifier.

12. The apparatus of claim 1, wherein the first current-control device is configured to:
    pull a current from or source a current to the common source node;
    receive an output signal from the output of the error amplifier at the control input of the first current-control device; and
    adjust the current pulled from or sourced to the common source node based on the received output signal.

13. The apparatus of claim 1, wherein:
    the first current-control device comprises a fourth transistor having a gate coupled to the output of the error amplifier; and
    the second current-control device comprises a fifth transistor having a gate coupled to the output of the error amplifier.

14. The apparatus of claim 13, wherein each of the fourth transistor and the fifth transistor comprises a respective n-type field effect transistor (NFET).

15. The apparatus of claim 13, wherein each of the fourth transistor and the fifth transistor comprises a respective p-type field effect transistor (PFET).

16. The apparatus of claim 1, wherein:
    the first transistor has a gate coupled to a first input of the sensing amplifier;
    the second transistor has a gate coupled to a second input of the sensing amplifier; and
    the first input of the sensing amplifier is configured to receive a first input voltage and the second input of the sensing amplifier is configured to receive a second input voltage.

17. The apparatus of claim 16, wherein:
    the first transistor has a drain coupled to a first output of the sensing amplifier; and
    the second transistor has a drain coupled to a second output of the sensing amplifier.

18. The apparatus of claim 17, further comprising a comparator having a first input and a second input, wherein the first input of the comparator is coupled to the first output of the sensing amplifier and the second input of the comparator is coupled to the second output of the sensing amplifier.

19. The apparatus of claim 1, further comprising a receiver coupled to the sensing amplifier.

20. The apparatus of claim 1, further comprising a comparator coupled to the sensing amplifier.

21. The apparatus of claim 20, further comprising:
    a latch coupled to the comparator; and
    a deserializer coupled to the latch.

22. An apparatus, comprising:
    an error amplifier having a first input, a second input, and an output;
    a sensing amplifier including a first transistor and a second transistor, wherein a source of the first transistor and a source of the second transistor are coupled to a common source node;
    a first current-control device coupled to the common source node, wherein the first current-control device has a control input coupled to the output of the error amplifier, wherein the first current-control device comprises a fourth transistor having a gate coupled to the output of the error amplifier, and wherein a drain of the fourth transistor is coupled to the common source node, and a source of the fourth transistor is coupled to a timing circuit;
    a replica circuit coupled to the first input of the error amplifier, wherein the replica circuit includes a third transistor replicating one of the first transistor and the second transistor;
    a second current-control device coupled to a source of the third transistor, wherein the second current-control device has a control input coupled to the output of the error amplifier; and
    a reference circuit coupled to the second input of the error amplifier, wherein the reference circuit is configured to output a reference signal.

23. The apparatus of claim 22, wherein the timing circuit is configured to drive the source of the fourth transistor with a clock signal.

* * * * *